US010663788B2

(12) United States Patent
Kudo et al.

(10) Patent No.: US 10,663,788 B2
(45) Date of Patent: May 26, 2020

(54) LIQUID CRYSTAL DISPLAY AND METHOD OF MANUFACTURING LIQUID CRYSTAL DISPLAY

(71) Applicant: Mitsubishi Electric Corporation, Tokyo (JP)

(72) Inventors: Yukihiro Kudo, Tokyo (JP); Koji Yonemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 112 days.

(21) Appl. No.: 15/805,171

(22) Filed: Nov. 7, 2017

(65) Prior Publication Data

US 2018/0136511 A1 May 17, 2018

(30) Foreign Application Priority Data

Nov. 16, 2016 (JP) .................................. 2016-223018

(51) Int. Cl.
*G02F 1/1335* (2006.01)
*H01L 27/12* (2006.01)
(Continued)

(52) U.S. Cl.
CPC ...... *G02F 1/133512* (2013.01); *G02F 1/1339* (2013.01); *G02F 1/133514* (2013.01);
(Continued)

(58) Field of Classification Search
CPC ......... G02F 1/133512; G02F 1/133514; G02F 1/1339; G02F 1/133305
See application file for complete search history.

(56) References Cited

U.S. PATENT DOCUMENTS 7,834,962 B2 11/2010 Satake et al.
7,986,394 B2 7/2011 Kamoshida
(Continued)

FOREIGN PATENT DOCUMENTS

JP 2007-333818 A 12/2007
JP 2008-145778 A 6/2008
(Continued)

OTHER PUBLICATIONS

Office Action mailed by the Japanese Patent Office dated Mar. 31, 2020, which corresponds to Japanese Patent Application No. 2016-223018 and is related to U.S. Appl. No. 15/805,171; with English language translation.

*Primary Examiner* — Lucy P Chien
(74) *Attorney, Agent, or Firm* — Studebaker & Brackett PC

(57) ABSTRACT

An array substrate includes inter-pixel patterns. A counter substrate includes light-shielding patterns. In a case where a position of an inter-pixel pattern to be noticed is displaced from a peak of a curved shape to a peripheral section of a display area, a shift amount of the position of a light-shielding pattern to be noticed when the counter substrate is in a flat state from the position of the inter-pixel pattern to be noticed when the array substrate is in a flat state first increases and then decreases. Alternatively, a substrate that is one of the array substrate and the counter substrate includes light-shielding patterns. In a case where a position of a light-shielding pattern to be noticed is displaced from a peak of a curved shape to a peripheral section of a display area, a width of the light-shielding pattern to be noticed first increases and then decreases.

8 Claims, 11 Drawing Sheets

(51) Int. Cl.
*G02F 1/1339* (2006.01)
*G02F 1/1368* (2006.01)

(52) U.S. Cl.
CPC ........ *H01L 27/1218* (2013.01); *G02F 1/1368* (2013.01); *G02F 2201/56* (2013.01)

(56) References Cited

U.S. PATENT DOCUMENTS

| | | | |
|---|---|---|---|
| 2008/0137013 A1 | 6/2008 | Kamoshida | |
| 2016/0026035 A1 | 1/2016 | Nagaoka et al. | |
| 2016/0026050 A1* | 1/2016 | Lin .................. | G02F 1/136286 349/43 |

FOREIGN PATENT DOCUMENTS

| | | |
|---|---|---|
| JP | 2009-150982 A | 7/2009 |
| JP | 2010-008875 A | 1/2010 |
| JP | 5026777 B2 | 9/2012 |
| JP | 2017-181818 A | 10/2017 |
| WO | 2014/141842 A1 | 9/2014 |

\* cited by examiner

LIQUID CRYSTAL DISPLAY AND METHOD OF MANUFACTURING LIQUID CRYSTAL DISPLAY

BACKGROUND OF THE INVENTION

Field of the Invention

The present invention relates to a liquid crystal display and a method of manufacturing such a liquid crystal display.

Description of the Background Art

There is a demand for a liquid crystal display to have a curved shape for the purpose of achieving a sophisticated design, a small footprint, or the like.

A typical liquid crystal display includes an array substrate and a counter substrate that are disposed opposite each other. The array substrate is provided with a plurality of inter-pixel patterns. For example, the array substrate may be provided with a plurality of gate wires and source wires. The counter substrate is provided with a plurality of light-shielding patterns that respectively correspond to the plurality of inter-pixel patterns. For example, the counter substrate may be provided with a plurality of black matrices.

To form a liquid crystal display into a curved shape, an array substrate and a counter substrate are bent in a curved direction. In this case, there is a risk that the array substrate and the counter substrate are displaced from each other, and thus the light-shielding patterns in the counter substrate are misaligned, in the curved direction, from the inter-pixel patterns in the array substrate. This misalignment may hinder the light-shielding patterns from blocking unwanted light, causing some disadvantages, such as leakages of light in oblique directions and mixing of different colors.

Japanese Patent Application Laid-Open Nos. 2007-333818 and 2010-008875 and Japanese Patent No. 5026777 disclose techniques to form a liquid crystal display into a curved shape, more specifically, to reduce a misalignment between an array substrate and a counter substrate which is caused by bending of the array substrate and the counter substrate.

In the technique of Japanese Patent Application Laid-Open No. 2007-333818, inter-pixel patterns (i.e., source lines) are formed in an array substrate (i.e., an active matrix substrate) (refer to paragraph 0062), and light-shielding patterns (i.e., black matrices) are formed in a counter substrate (refer to paragraph 0062). Further, pitch (i.e., pitch P1) of the inter-pixel patterns is set to be smaller than pitch (i.e., pitch P2) of the light-shielding patterns (refer to paragraph 0063 and FIG. 5), and the difference between the former pitch and the latter pitch increases with coming close to a peripheral section of a display area (i.e., both ends of a curve of a liquid crystal display panel) (refer to paragraphs 0067 and 0068).

In the technique of Japanese Patent Application Laid-Open No. 2010-008875, light-shielding patterns (i.e., vertical BMs) are formed in a counter substrate (i.e., a CF substrate) (refer to paragraphs 0016 and 0017). The width of the light-shielding pattern increases from a central section of a display area (i.e., a center of a liquid crystal panel) to a peripheral section of the display area (i.e., a peripheral section of the liquid crystal panel) (refer to the paragraph 0019).

In the technique of Japanese Patent No. 5026777, light-shielding patterns (i.e., black matrices) are formed in a counter substrate (i.e., a CF substrate) (refer to paragraph 0037). The light-shielding patterns in a central section of a display area (i.e., a central area of the CF substrate) are set to be wider than those in a peripheral section of the display area (i.e., each end area of the CF substrate) (refer to paragraph 0037).

The above techniques aim to reduce an occurrence of disadvantages that is attributed to bending of the array substrate and the counter substrate disposed opposite each other. These techniques assume that a misalignment of the light-shielding pattern from the wiring pattern in the curved direction, which is attributed to bending of the array substrate and the counter substrate, monotonously increases toward the peripheral section of the display area. These techniques intend to reduce an occurrence of disadvantages, such as leakages of light in oblique directions and mixing of different colors, that is attributed to the misalignment, depending on the structure in which the light-shielding patterns are disposed so that the pitch of the light-shielding patterns decreases with coming close to the peripheral area of the display area, or the structure in which the light-shielding patterns are disposed so that the width of the light-shielding pattern increases with coming close to the peripheral area of the display area.

SUMMARY OF THE INVENTION

The above techniques can reduce, to some extent, an occurrence of disadvantages, such as leakages of light in oblique directions and mixing of different colors, that is attributed to the misalignment which may be caused by bending of the array substrate and the counter substrate. However, preparation of some prototypes and investigations on the situations of the misalignments revealed that the structures of the above techniques might not sufficiently reduce an occurrence of disadvantages, such as leakages of light in oblique directions and mixing of different colors, which are caused by the misalignment. This is because in these structures, the pitch or widths of the light-shielding patterns are adjusted on the assumption that the misalignment monotonously increases toward the peripheral section of the display area.

An object of the present invention is to reduce an occurrence of disadvantages associated with curved liquid crystal displays, such as leakages of light in oblique directions and mixing of different colors, that is attributed to a misalignment between an array substrate and a counter substrate which may be caused by bending of the array substrate and the counter substrate, thereby providing a liquid crystal display that can display high-quality images.

The present invention relates to a liquid crystal display.

According to a first aspect of a liquid crystal display of the present invention, an array substrate is curved in a curved direction, and a counter substrate is curved in the curved direction so as to fit on the array substrate.

The array substrate includes a plurality of inter-pixel patterns that are disposed within a display area and arrayed in the curved direction.

The counter substrate includes a plurality of light-shielding patterns that are disposed within the display area and arrayed in the curved direction.

The plurality of light-shielding patterns respectively correspond to the plurality of inter-pixel patterns.

In the case where a position, in the curved direction, of an inter-pixel pattern to be noticed among the plurality of inter-pixel patterns is displaced from a peak of a curved shape to a peripheral section of the display area, a shift amount first increases and then decreases. The shift amount is a shifted amount of a position, in the curved direction, of a light-shielding pattern to be noticed among the plurality of light-shielding patterns when the counter substrate is in a flat state from the position of the inter-pixel pattern to be noticed in the curved direction when the array substrate is in a flat state. The light-shielding pattern to be noticed corresponds to the inter-pixel pattern to be noticed.

Reduced is an occurrence of disadvantages such as leakages of light in oblique directions and mixing of different colors, that is attributed to a misalignment between the array substrate and the counter substrate which may be caused by bending the array substrate and the counter substrate in a curved liquid crystal display. Consequently, a liquid crystal display that can display high-quality images is provided.

According to a second aspect of a liquid crystal display of the present invention, a first substrate is curved in a curved direction, and a second substrate is curved in the curved direction so as to fit on the first substrate.

The first substrate is one of the array substrate and the counter substrate. The second substrate is the other of the array substrate and the counter substrate.

The first substrate includes a plurality of first light-shielding patterns that are disposed within a display area and arrayed in a curved direction.

The second substrate includes a plurality of second light-shielding patterns that are disposed within the display area and arrayed in the curved direction.

The plurality of second light-shielding patterns respectively correspond to the plurality of first light-shielding patterns.

In the case where a position, in the curved direction, of a light-shielding pattern to be noticed among the plurality of second light-shielding patterns is displaced from a peak of a curved shape to a peripheral section of the display area, a width of the light-shielding pattern to be noticed in the curved direction first increases and then decreases.

Reduced is an occurrence of disadvantages such as leakages of light in oblique directions and mixing of different colors, that is attributed to a misalignment between an array substrate and a counter substrate which may be caused by bending the array substrate and the counter substrate in a curved liquid crystal display. Consequently, a liquid crystal display that can display high-quality images is provided.

The present invention is also directed to a method of manufacturing a liquid crystal display.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 9:
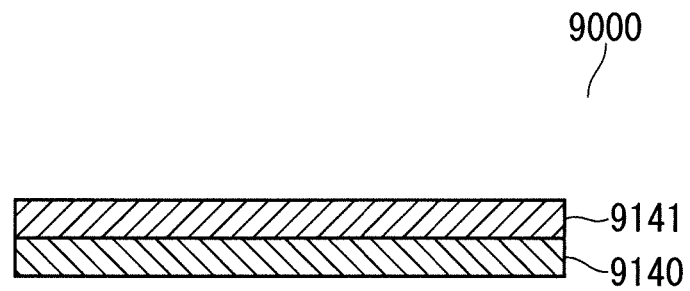
FIG. 9 is a cross-sectional view of a flat liquid crystal panel for use in analyzing misalignment amounts of light-shielding patterns from wiring patterns.
Figure 10:
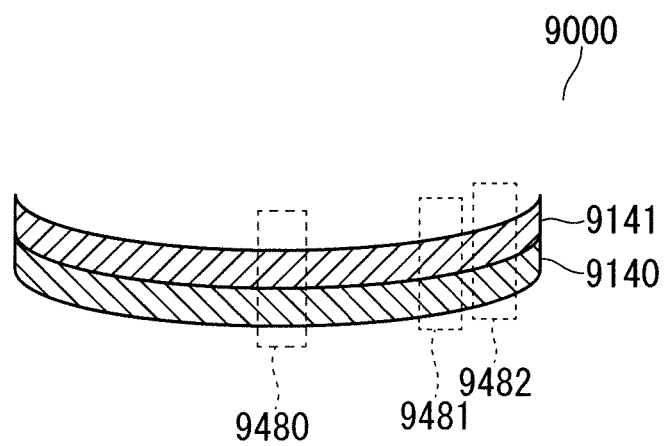
FIG. 10 is a cross-sectional view of a curved liquid crystal panel for use in analyzing misalignment amounts of light-shielding patterns from wiring patterns.

1. Analysis of Misalignment Amount of Light-Shielding Pattern from Wiring Pattern FIG. 9 is a schematic, cross-sectional view of a flat liquid crystal panel for use in analyzing misalignment amounts of light-shielding patterns from wiring patterns. FIG. 10 is a schematic, cross-sectional view of a curved liquid crystal panel for use in analyzing misalignment amounts of light-shielding patterns from wiring patterns.

A flat liquid crystal panel 9000 illustrated in FIG. 9 and a curved liquid crystal panel 9000 illustrated in FIG. 10 each include an array substrate 9140 and a counter substrate 9141. The curved liquid crystal panel 9000 illustrated in FIG. 10 is obtained by bending the flat liquid crystal panel 9000 illustrated in FIG. 9 in such a way that the counter substrate 9141 is positioned on the incurved side of the array substrate 9140.

Figure 11:
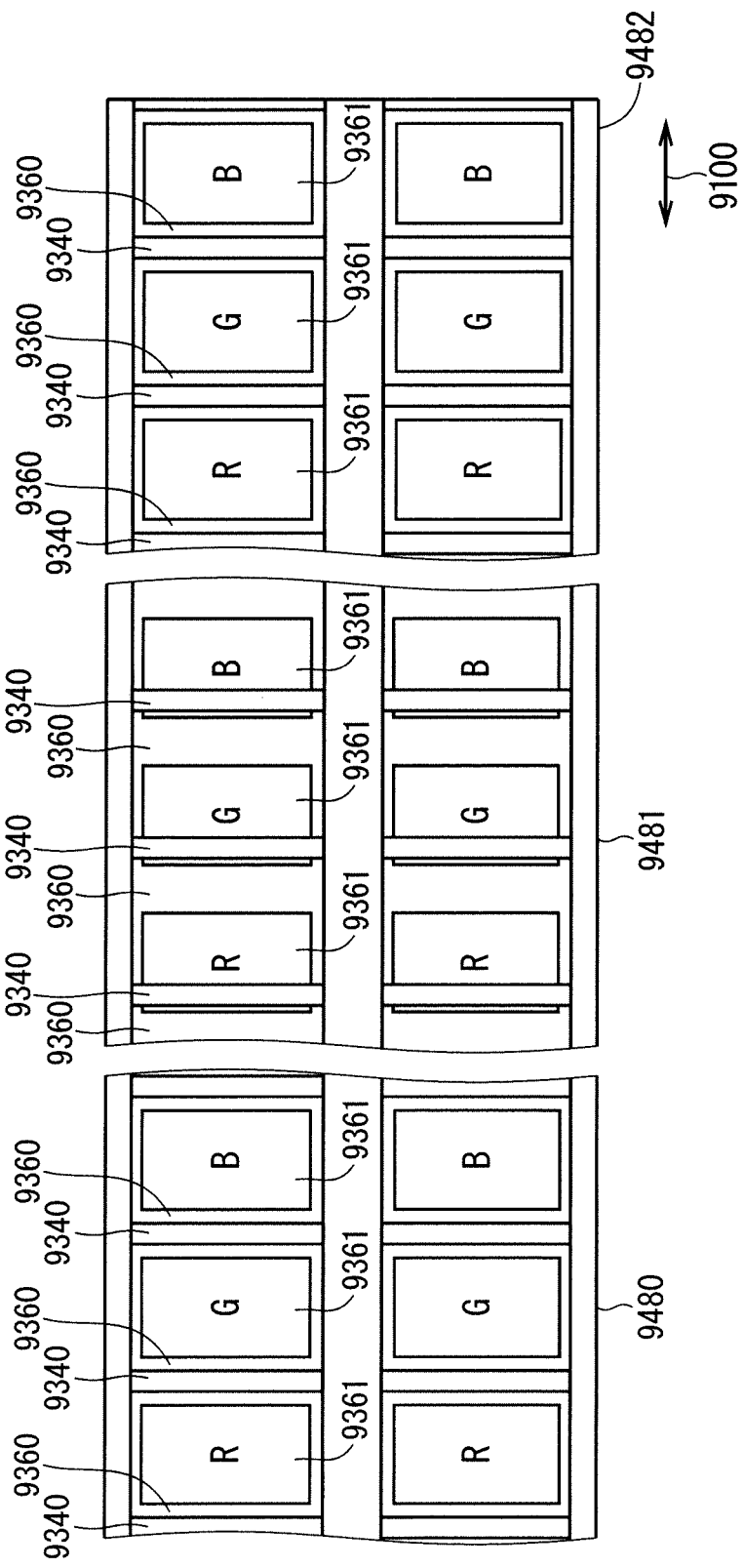
FIG. 11 is a plan view of wiring patterns, light-shielding patterns, and coloring sections included in a liquid crystal panel for use in analyzing misalignment amounts of the light-shielding patterns from the wiring patterns.

FIG. 11 is a schematic plan view of wiring patterns, light-shielding patterns, and coloring sections included in a liquid crystal panel for use in analyzing misalignment amounts of the light-shielding patterns from the wiring patterns. FIG. 11 is drawn so that the wiring patterns come to front side than the light-shielding patterns and the coloring section.

The array substrate 9140 includes a plurality of wiring patterns 9340 illustrated in FIG. 11. The counter substrate 9141 includes a plurality of light-shielding patterns 9360 and coloring sections 9361 illustrated in FIG. 11.

The plurality of light-shielding patterns 9360 respectively correspond to the plurality of wiring patterns 9340.

In the flat liquid crystal panel 9000 illustrated in FIG. 9, the plurality of light-shielding patterns 9360 are respectively disposed over the plurality of wiring patterns 9340.

In the curved liquid crystal panel 9000 illustrated in FIG. 10, however, the misalignment amount of a light-shielding pattern 9360 from a wiring pattern 9340 to which the light-shielding pattern 9360 corresponds increases with coming close to a peripheral section 9482 of a display area in a range from a central section 9480 of a display area to a maximum misalignment section 9481 thereof. The misalignment amount is maximized in the maximum misalignment section 9481 of the display area. On the contrary, the misalignment amount decreases with coming close to the peripheral section 9482 of the display area in a range from the maximum misalignment section 9481 of the display area to the peripheral section 9482 thereof.

Accordingly, in the central section 9480 of the display area, the light-shielding patterns 9360 are disposed over the wiring patterns 9340. In the maximum misalignment section 9481 of the display area, the light-shielding patterns 9360 are disposed over the coloring section 9361, not over the wiring patterns 9340. In the peripheral section 9482 of the display area, the light-shielding patterns 9360 are disposed over the wiring patterns 9340.

Figure 12:
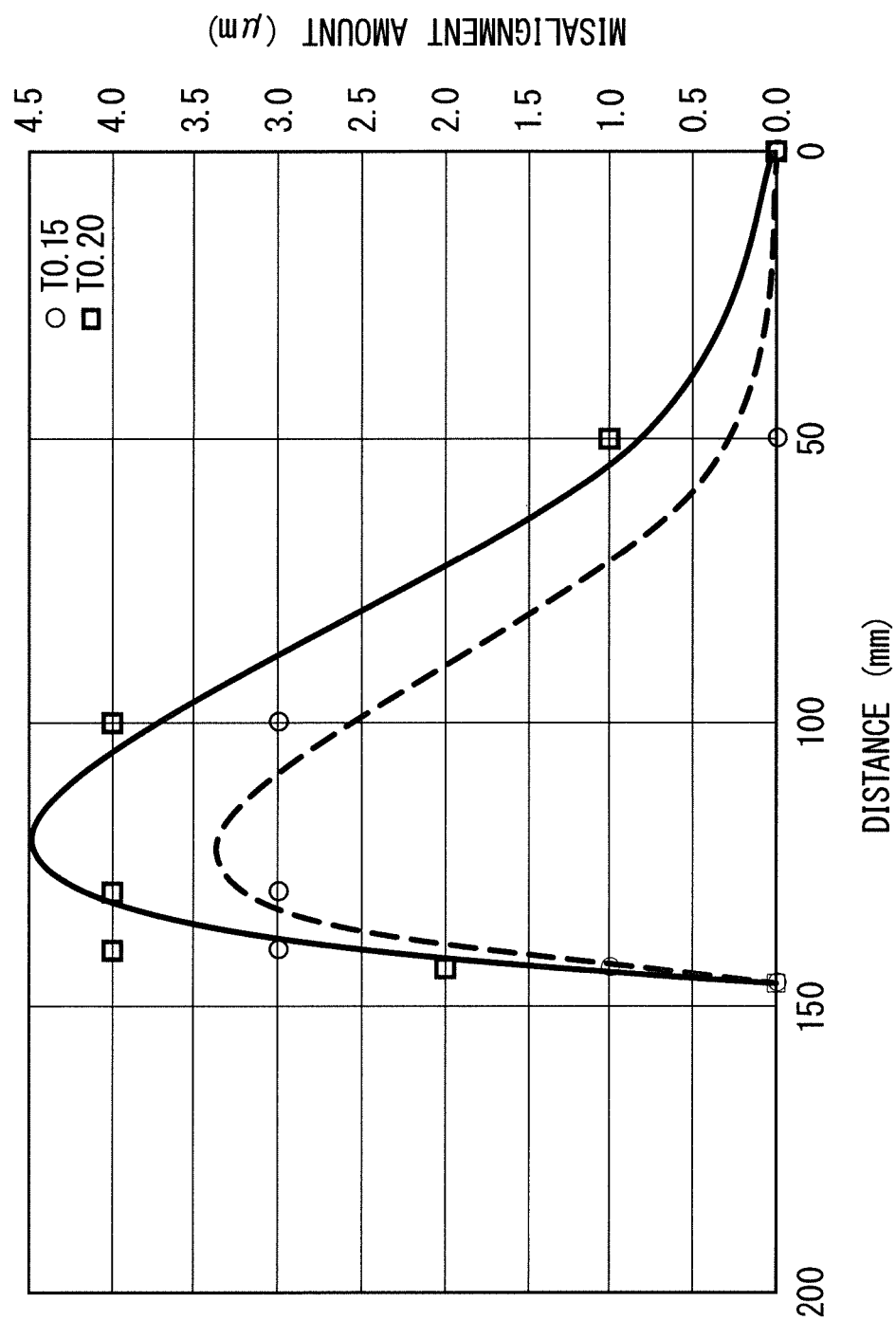
FIG. 12 is a graph showing variations in misalignment amounts of light-shielding patterns from wiring patterns to which the light-shielding patterns correspond in a curved direction in proportion to a distance from a central section of a display area.

FIG. 12 is a graph showing variations in misalignment amounts of light-shielding patterns from wiring patterns in a curved direction in proportion to a distance from a central section of a display area. FIG. 12 illustrates the variations when the curved liquid crystal panel has a display length of about 290 mm and is curved with its radius of curvature being about 800 mm. FIG. 12 illustrates the variations in the two cases; in the first case, the thicknesses of the array substrate and the counter substrate are set to about 0.15 mm, and in the second case, the thicknesses thereof are set to about 0.20 mm.

As illustrated in FIG. 12, the misalignment amount becomes zero in the central section 9480 of the display area at which the distance from the central section 9480 of the display area is 0 mm. The misalignment amount increases with the increase of the distance in the range between the central section 9480 of the display area and the maximum misalignment section 9481 thereof at which the distance is about 120 mm. The misalignment amount decreases with the increase of the distance in the range between the maximum misalignment section 9481 of the display area and the peripheral section 9482 thereof at which the distance is about 145 mm. The misalignment amount becomes zero in the peripheral section 9482 of the display area.

When the substrate thickness T is set to about 0.20 mm, the misalignment amount becomes about 4.5 μm in the maximum misalignment section 9481 of the display area. When the substrate thickness T is set to about 0.15 mm, the misalignment amount becomes about 3.5 μm in the maximum misalignment section 9481 of the display area.

Thus, the misalignment amount does not monotonously increase with the increase of the distance. However, none of the techniques in Japanese Patent Application Laid-Open Nos. 2007-333818 and 2010-008875 and Japanese Patent No. 5026777 allow for the fact that the misalignment amount does not monotonously increase with the increase of the distance. Therefore, on the assumption that the misalignment amount monotonously increases with the increase of the distance, these techniques adjust the pitch of the light-shielding patterns 9360 to shift their positions or adjust the widths thereof. For this reason, the techniques, for example, suffer disadvantages which are attributed to the fact that improper shift amounts of the positions of the light-shielding patterns 9360 cause the misalignments of the light-shielding patterns 9360 from the wiring patterns 9340, or suffer lowered luminance which is attributed to the fact that the wide shielding-patterns 9360 cause narrow openings.

2. First Preferred Embodiment 2.1 Liquid Crystal Display

Figure 1:
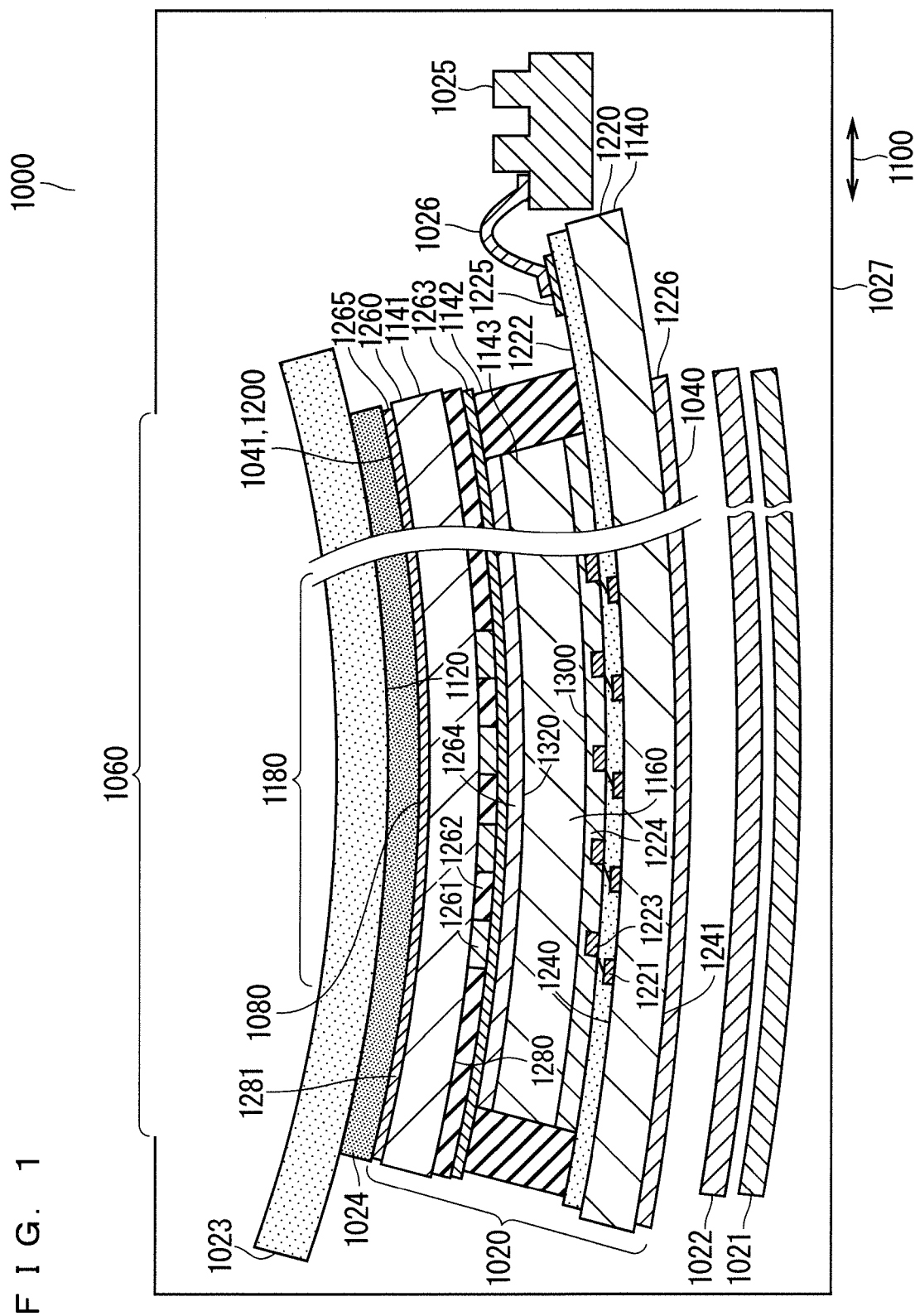
FIG. 1 is a cross-sectional view of a liquid crystal display of a first preferred embodiment of the present invention.

FIG. 1 is a schematic, cross-sectional view of a liquid crystal display of a first preferred embodiment of the present invention.

A liquid crystal display 1000 illustrated in FIG. 1 is a curved liquid crystal display in which thin film transistors (TFTs) serve as switching elements. The liquid crystal display 1000 may also be referred to as the liquid crystal displaying apparatus.

The liquid crystal display 1000 includes a liquid crystal panel 1020, a backlight 1021, an optical sheet 1022, a curved transparent protective cover 1023, a transparent adhesive sheet 1024, a control substrate 1025, a flexible flat cable (FFC) 1026, and a housing 1027. The liquid crystal display 1000 may further include some other components. Some of these components may be omitted from the liquid crystal display 1000.

The backlight 1021 faces one main surface 1040 of the liquid crystal panel 1020 with the optical sheet 1022 therebetween. The curved transparent protective cover 1023 faces the other main surface 1041 of the liquid crystal panel 1020 with the transparent adhesive sheet 1024 therebetween, and is bonded to the other main surface 1041 of the liquid crystal panel 1020 by the transparent adhesive sheet 1024. The FFC 1026 electrically connects the control substrate 1025 to a terminal 1225 included in the liquid crystal panel 1020. The housing 1027 accommodates the liquid crystal panel 1020, the backlight 1021, the optical sheet 1022, the curved transparent protective cover 1023, the transparent adhesive sheet 1024, the control substrate 1025, and the FFC 1026. In the housing 1027, an opening 1060 is formed, The opening 1060 is formed so that a display surface 1080 of the liquid crystal panel 1020 can be visually perceive from the outside of the housing 1027 through the opening 10160.

The liquid crystal panel 1020 and the curved transparent protective cover 1023 are curved in a curved direction 1100. The curved transparent protective cover 1023 has a retained surface 1120 whose curvature conforms to that of the other main surface 1041 of the liquid crystal panel 1020. The retained surface 1120 is bonded to the other main surface 1041 of the liquid crystal panel 1020 with the transparent adhesive sheet 1024. Accordingly, the other main surface 1041 of the liquid crystal panel 1020 is thereby protected by the curved transparent protective cover 1023.

When an image is displayed on the liquid crystal display 1000, the backlight 1021 in a curved shape serves as a light source to radiate light. The radiated light passes through the optical sheet 1022. When the light passes through the optical sheet 1022, its polarization, directivity, and other properties are controlled. The light that has passed through the optical sheet 1022 is incident on one main surface 1040 of the liquid crystal panel 1020. The light that has been incident on one main surface 1040 passes through a plurality of pixels in the liquid crystal panel 1020 and is emitted from the other main surface 1041 of the liquid crystal panel 1020. The emitted light passes through the transparent adhesive sheet 1024 and the curved transparent protective cover 1023 sequentially.

Moreover, when the image is displayed on the liquid crystal display 1000, the control substrate 1025 outputs an electrical signal. The output electrical signal is input to the terminal 1225 through the FFC 1026. The liquid crystal panel 1020 controls the transmittance of the light in a plurality of pixels, in accordance with the input electrical signal. As a result, the image in accordance with the input electrical signal is displayed on the display surface 1080. The displayed image is visually perceived through the opening 1060.

The control substrate 1025 includes, for example, a driving integrated circuit (IC) that generates a driving signal, and outputs electrical signals including the generated driving signal.

The FFC 1026 may be replaced with another type of cable. The control substrate 1025 may be connected directly to the liquid crystal panel 1020 without using the FFC 1026. The terminal of the driving IC may be connected directly to the terminal 1225.

The liquid crystal panel 1020 is a transmissive liquid crystal panel. However, the transmissive liquid crystal panel 1020 may be replaced with a reflective or semi-transmissive liquid crystal panel. A semi-transmissive liquid crystal panel exhibits both the features of transmissive and reflective liquid crystal panels. If the transmissive liquid crystal panel 1020 is replaced with a reflective liquid crystal panel, the backlight 1021 and the optical sheet 1022 are removed and a reflector is added instead. If the transmissive liquid crystal panel 1020 is replaced with a semi-transmissive liquid crystal panel, a reflector is added.

2.2 Liquid Crystal Panel

The liquid crystal panel 1020 includes an array substrate 1140, a counter substrate 1141, a seal material 1142, and a liquid crystal material 1143. The liquid crystal panel 1020 may further include some other components.

The counter substrate 1141 faces the array substrate 1140 with a gap 1160 therebetween. The seal material 1142 is disposed in the gap 1160, surrounds a display area 1180, and allows the counter substrate 1141 to be bonded to the array substrate 1140. The liquid crystal material 1143 is disposed in the gap 1160, is surrounded by the seal material 1142, and encapsulated within the display area 1180. As a result, an outer main surface 1200 of the counter substrate 1141, which corresponds to the other main surface 1041 of the liquid crystal panel 1020, contains the display surface 1080 on which an image is to be displayed and which is within the display area 1180.

The array substrate 1140 is curved in the curved direction 1100. The counter substrate 1141 is curved in the curved direction 1100 so as to fit on the array substrate 1140. The counter substrate 1141 is disposed on the incurved side of the array substrate 1140. The outer main surface 1200 of the counter substrate 1141 is incurved.

Each of the array substrate 1140 and the counter substrate 1141 has a planar, rectangle-like shape. The curved direction 1100 is parallel to the longer direction of the array substrate 1140 and the counter substrate 1141 and to the direction on which the curvature is maximized. However, the curved direction 1100 may be parallel to a direction other than the longer direction of the array substrate 1140 and the counter substrate 1141. For example, the curved direction 1100 may be parallel to the shorter direction of the array substrate 1140 and the counter substrate 1141. Each of the array substrate 1140 and the counter substrate 1141 may have another planar shape.

The array substrate 1140, being a TFT array substrate, includes a glass substrate 1220, a plurality of TFTs 1221, an insulating film 1222, a plurality of pixel electrodes 1223, an orientation film 1224, a plurality of gate wires, a plurality of source wires, the terminal 1225, a transfer electrode, and a polarization plate 1226. None of the plurality of gate wires, the plurality of source wires, and the transfer electrode is illustrated in FIG. 1. The array substrate 1140 may further include some other components. Some of these components may be omitted from the array substrate 1140.

The plurality of TFTs 1221 are disposed on an inner main surface 1240 of the glass substrate 1220. The plurality of TFTs 1221 are arranged in a matrix fashion. The insulating film 1222 is stacked on the plurality of TFTs 1221 and disposed on the inner main surface 1240 of the glass substrate 1220, thereby covering the plurality of TFTs 1221. The plurality of pixel electrodes 1223 are stacked on the insulating film 1222 and disposed over the inner main surface 1240 of the glass substrate 1220. The terminal 1225 is stacked on the insulating film 1222 and disposed over the inner main surface 1240 of the glass substrate 1220. The terminal 1225 is disposed outside the display area 1180. The orientation film 1224 is stacked on the insulating film 1222 and the plurality of pixel electrodes 1223 and disposed over the inner main surface 1240 of the glass substrate 1220. The orientation film 1224 is disposed within the display area 1180 while being in contact with the liquid crystal material 1143. The orientation film 1224 is brought into contact with the liquid crystal material 1143, thereby orienting the liquid crystal material 1143. The transfer electrode is disposed outside the display area 1180.

The polarization plate 1226 is disposed on an outer main surface 1241 of the glass substrate 1220.

The counter substrate 1141, being a color filter substrate, includes a glass substrate 1260, a plurality of color filters 1261, a plurality of black matrices 1262, a common electrode 1263, an orientation film 1264, and a polarization plate 1265. The counter substrate 1141 may further include some other components. Some of these components are may be omitted from the counter substrate 1141.

The plurality of color filters 1261 and black matrices 1262 are disposed on an inner main surface 1280 of the glass substrate 1260. The common electrode 1263 is stacked on the plurality of color filters 1261 and black matrices 1262 and disposed on the inner main surface 1280 of the glass substrate 1260. The orientation film 1264 is stacked on the common electrode 1263 and disposed on the inner main surface 1280 of the glass substrate 1260. The orientation film 1264 is disposed within the display area 1180 while being in contact with the liquid crystal material 1143. The orientation film 1264 is brought into contact with the liquid crystal material 1143, thereby orienting the liquid crystal material 1143.

The polarization plate 1265 is disposed on the outer main surface 1281 of the glass substrate 1260.

When the image is displayed on the liquid crystal display 1000, the electrical signal is input to the terminal 1225. A driving signal in accordance with the input electrical signal is supplied to a TFT 1221 that corresponds to each pixel through a gate wire and a source wire that correspond to each pixel, each pixel being each of a plurality of pixels. A driving voltage in accordance with the driving signal supplied to the TFT 1221 that corresponds to each pixel is supplied to a pixel electrode 1223 that corresponds to each pixel. In addition, a driving signal in accordance with the input electrical signal is supplied to the common electrode 1263 through the transfer electrode. By applying the driving voltages to the pixel electrode 1223 that corresponds to each pixel and the common electrode 1263, the electric field between the pixel electrode 1223 that corresponds to each pixel and the common electrode 1263 is controlled. Also, the orientation of a liquid crystal material 1143 disposed between the pixel electrode 1223 that corresponds to each pixel and the common electrode 1263 is controlled, and the change in the polarization of the light passing through the liquid crystal material 1143 disposed between the pixel electrode 1223 that corresponds to each pixel and the common electrode 1263 is controlled. The orientation of the liquid crystal material 1143 is changed by varying the voltages for driving the liquid crystal material 1143 so that the orientations of a number of liquid crystal molecules making up the liquid crystal material 1143 are changed.

When the image is displayed on the liquid crystal display 1000, the light is caused to be incident on one main surface 1040 of the liquid crystal display 1000. The light that has been caused to be incident on one main surface 1040 passes through the polarization plate 1226, the liquid crystal material 1143 disposed between the pixel electrode 1223 that corresponds to each pixel and the common electrode 1263, and the polarization plate 1265 sequentially. The polarization plate 1226 selectively transmits light with a first polarization state. The polarization plate 1265 selectively transmits light with a second polarization state. The light transmittance in each pixel increases as the change in the polarization of light that pass thorough the liquid crystal material 1143 disposed between the pixel electrode 1223 that corresponds to each pixel and the common electrode 1263 comes close to the change from a first polarization state to a second polarization state.

The liquid crystal panel 1020 is a transmissive liquid crystal panel. Accordingly, the liquid crystal panel 1020 is provided with glass substrates 1220 and 1260 as transparent substrates. However, at least one of the glass substrates 1220 and 1260 made of glass may be replaced with a transparent substrate made of transparent material other than glass. For example, at least one of the glass substrates 1220 and 1260 may be replaced with a transparent substrate made of transparent plastic or quartz.

Each of the glass substrates 1220 and 1260 has flexibility and a small thickness; for example, the thickness is about 0.2 mm.

If the transmissive liquid crystal panel 1020 is replaced with a reflective liquid crystal panel, one of the glass substrates 1220 and 1260 may be replaced with a nontransparent substrate. An example of such a nontransparent substrate is a silicon substrate.

Even if at least one of the glass substrates 1220 and 1260 is replaced with a substrate made of material other than glass, the substrate has flexibility.

The seal material 1142 may be made of resin.

If the liquid crystal material 1143 is injected by a vacuum injection method in which the liquid crystal material 1143 is injected through an inlet in a vacuum, the inlet is formed in the seal material 1142, and the liquid crystal panel 1020 includes a sealant that seals the inlet.

If the liquid crystal material 1143 is injected by a liquid droplet injection method in which the liquid crystal material 1143 is disposed in droplet-like form, and the counter substrate 1141 is bonded to the array substrate 1140 in a vacuum, an inlet is not formed in the seal material 1142, and the liquid crystal panel 1020 does not include a sealant that seals the inlet.

The liquid crystal panel 1020 includes a plurality of spacers and a transfer material, none of which is illustrated in FIG. 1.

The plurality of spacers are disposed inside the gap 1160. With these spacers, the distance from an inner main surface 1300 of the array substrate 1140 to an inner main surface 1320 of the counter substrate 1141 is maintained constant. The plurality of spacers may be particle-like spacers that are distributed on the inner main surface 1300 of the array substrate 1140 or the inner main surface 1320 of the counter substrate 1141. Alternatively, the plurality of spacers may be pillar-like spacers that are formed on the inner main surface 1300 of the array substrate 1140 or the inner main surface 1320 of the counter substrate 1141. The latter spacers are formed by subjecting resin to patterning.

The transfer material electrically connects the transfer electrode to the common electrode 1263. Accordingly, the signal input to the terminal is transmitted to the common electrode 1263 through the transfer electrode.

The transfer material may be omitted. For example, if the seal material 1142 contains conductive particles and thus can serve as the transfer material, any independent transfer material is unnecessary.

The liquid crystal panel 1020 operates in a twisted nematic (TN) mode. However, the liquid crystal panel 1020 may operate in another mode. For example, the liquid crystal panel 1020 may operate in a super twisted nematic (STN) mode or in a ferroelectric liquid crystal mode.

The liquid crystal panel 1020 is a liquid crystal panel that drives the liquid crystal material 1143 by means of a vertical electric field scheme. The liquid crystal panel 1020 may be replaced with a liquid crystal panel that drives a liquid crystal material by means of the transverse electric field scheme. In the liquid crystal panel that drives a liquid crystal material by means of a transverse electric field scheme, a common electrode is provided in an array substrate, instead of a counter substrate. In this case, the direction of the electric field between a pixel electrode and the common electrode is coincident with a lateral direction, and a liquid crystal between the pixel electrode and the common electrode is driven by this electric field.

2.3 Wiring Patterns, Light-Shielding Patterns, and Coloring Section Array

Figure 2:
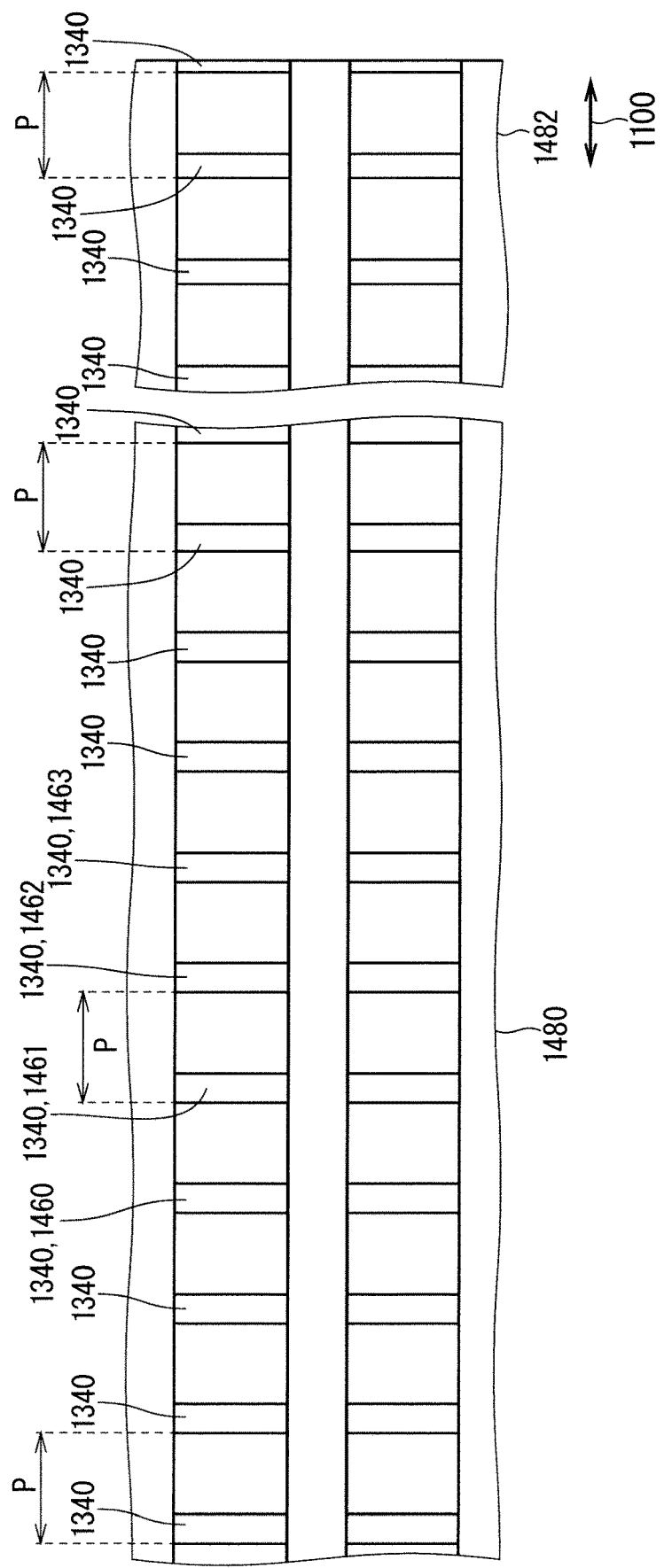
FIG. 2 is a plan view of wiring patterns included in the liquid crystal display of the first preferred embodiment.
Figure 3:
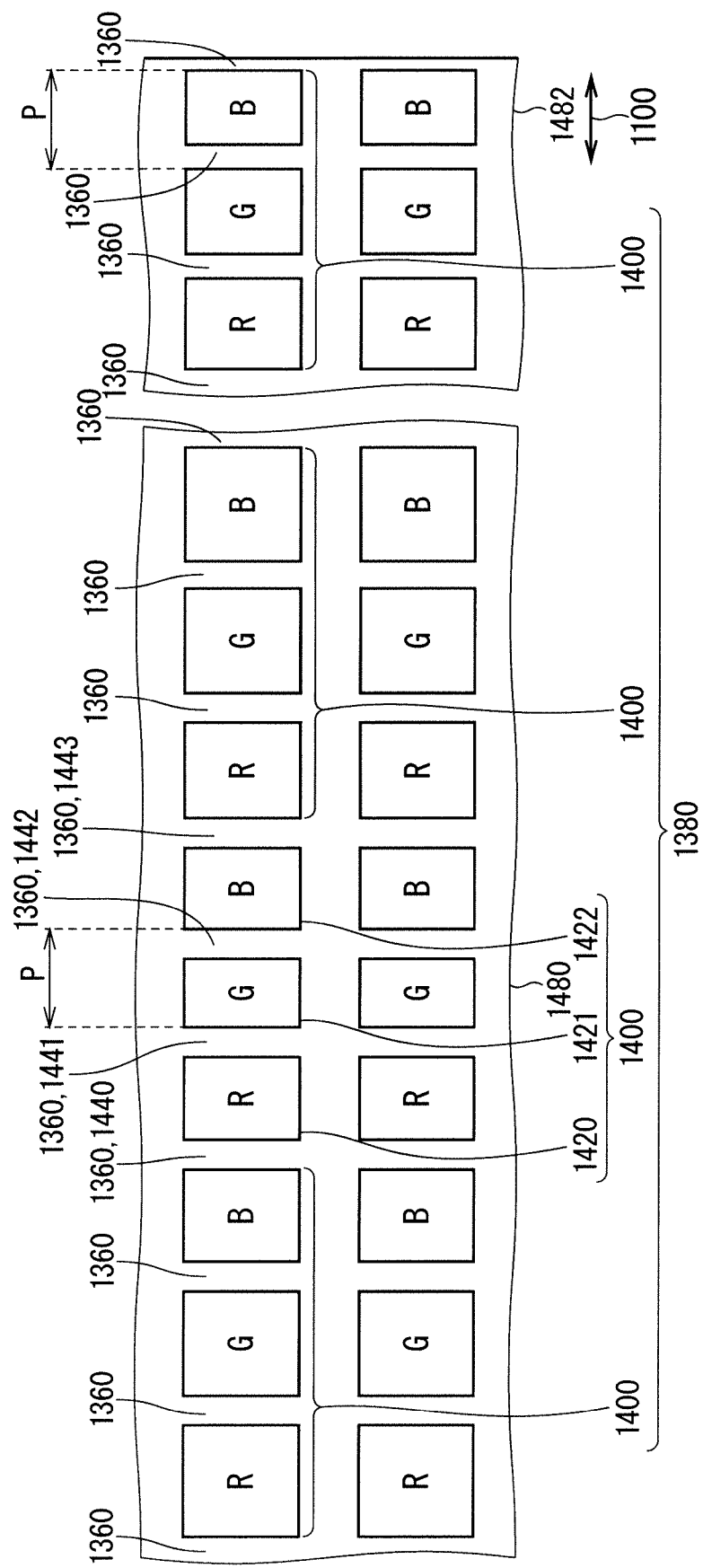
FIG. 3 is a plan view of light-shielding patterns and coloring sections included in the liquid crystal display of the first preferred embodiment.

FIG. 2 is a plan view of wiring patterns included in the liquid crystal display of the first preferred embodiment. FIG. 3 is a plan view of light-shielding patterns and a coloring section array included in the liquid crystal display of the first preferred embodiment. FIG. 2 illustrates planar shapes of the wiring patterns when an array substrate is in a flat state. FIG. 3 illustrates planar shapes of the light-shielding patterns and the coloring section array when the counter substrate is in a flat state.

The array substrate 1140 includes a plurality of wiring patterns 1340 illustrated in FIG. 2.

The plurality of wiring patterns 1340 are a plurality of source wires. The plurality of wiring patterns 1340 may be a plurality of inter-pixel patterns other than the source wires. For example, the plurality of wiring patterns 1340 may be a plurality of gate wires or black matrices. If the liquid crystal panel 1020 is replaced with a liquid crystal panel that drives a liquid crystal material by means of the transverse electric field scheme, the plurality of wiring patterns 1340 may be a plurality of common wires.

The plurality of wiring patterns 1340 are disposed within the display area 1180 and arrayed in the curved direction 1100. Each of the plurality of wiring patterns 1340 is a line-like light-shielding pattern and extends in a direction perpendicular to the curved direction 1100.

The counter substrate 1141 includes a plurality of light-shielding patterns 1360 illustrated in FIG. 3.

The plurality of light-shielding patterns 1360 are a plurality of black matrices 1262. The plurality of light-shielding patterns 1360 may be a plurality of light-shielding patterns other than the plurality of the black matrices 1262.

The plurality of light-shielding patterns 1360 are disposed within the display area 1180 and arrayed in the curved direction 1100. Each of the plurality of light-shielding patterns 1360 has a line-like shape and extends in a direction perpendicular to the curved direction 1100.

The counter substrate 1141 further includes a coloring section array 1380 illustrated in FIG. 3.

The coloring section array 1380 includes the plurality of color filters 1261.

The coloring section array 1380 includes a plurality of repetition units 1400.

The plurality of repetition units 1400 are arrayed in the curved direction 1100.

Each of the plurality of repetition units 1400 includes a first coloring section 1420, a second coloring section 1421, and a third coloring section 1422. The first coloring section 1420, the second coloring section 1421, and the third coloring section 1422 belong to the same picture element, and respectively serves as openings through which red, green and blue light selectively passes. The first coloring section 1420, the second coloring section 1421, and the third coloring section 1422 may be replaced with three or more coloring sections that respectively transmit light with three or more colors other than red, green, and blue.

As illustrated in FIG. 3, the plurality of light-shielding patterns 1360 include a first light-shielding pattern 1440, a second light-shielding pattern 1441, a third light-shielding pattern 1442, and a fourth light-shielding pattern 1443, corresponding to each of the plurality of repetition units 1400. Among the first light-shielding pattern 1440, the second light-shielding pattern 1441, the third light-shielding pattern 1442, and the fourth light-shielding pattern 1443, the i-th light-shielding pattern is adjacent to the (i+1)th light-shielding pattern, and the i-th coloring section is present between the i-th and (i+1)th light-shielding patterns. The number i is each of integers of 1 to 3.

As illustrated in FIG. 2, the plurality of wiring patterns 1340 include a first wiring pattern 1460, a second wiring pattern 1461, a third wiring pattern 1462, and a fourth wiring pattern 1463, corresponding to each of the plurality of repetition units 1400. The first wiring pattern 1460, the second wiring pattern 1461, the third wiring pattern 1462, and the fourth wiring pattern 1463 respectively correspond to the first light-shielding pattern 1440, the second light-shielding pattern 1441, the third wiring pattern 1462, and the fourth wiring pattern 1463.

2.4 Variation in Shift Amount

The plurality of light-shielding patterns 1360 respectively correspond to the plurality of wiring patterns 1340.

In the first preferred embodiment, the pitch of the light-shielding patterns 1360 is adjusted, the misalignment generated between the array substrates 1140 and the counter substrates 1141 when the liquid crystal panel 1020 is bent being allowed for.

In the first preferred embodiment, when the array substrate 1140 is in a flat state, the pixel pitch of the array substrate 1140, which is the distance between adjacent ones of the plurality of wiring patterns 1340, is maintained to be regular pixel pitch P, as illustrated in FIG. 2. The pixel pitch of the array substrate 1140 takes the pixel pitch P in any of the central section 1480 of the display area 1180, the maximum misalignment section thereof, and the peripheral section 1482 thereof.

In the first preferred embodiment, however, when the counter substrate 1141 is in a flat state, the pixel pitch of the counter substrate 1141, which is the distance between adjacent ones of the plurality of light-shielding patterns 1360, is not maintained to be the regular pixel pitch P, as illustrated in FIG. 3. The pixel pitch takes the pixel pitch P which is the same as the pixel pitch of the array substrate 1140 in the central section 1480 of the display area 1180. It sequentially increases little by little in the range from the central section 1480 of the display area 1180 to the maximum misalignment section thereof. It is maximized in the maximum misalignment section of the display area 1180. It sequentially decreases little by little in the range from the maximum misalignment section of the display area 1180 to the peripheral section 1482 thereof. It takes the pixel pitch P again in the peripheral section 1482 of the display area 1180.

Thus, in the case where the position, in the curved direction 1100, of a wiring pattern 1340 to be noticed among the plurality of wiring patterns 1340 is displaced from the central section 1480 of the display area 1180 to the peripheral section 1482 thereof, the shift amount first increases and then decreases, the shift amount being a shifted amount of the position, in the curved direction 1100, of a light-shielding pattern 1360 to be noticed among the plurality of light-shielding patterns 1360 when the counter substrate 1141 is in a flat state from the position of the wiring pattern 1340 to be noticed in the curved direction 1100 when the array substrate 1140 is in a flat state. The shift amount is maximized in the maximum misalignment section of the display area 1180. Accordingly, the shift amount sequentially increases little by little in the range from the central section 1480 of the display area 1180 to the maximum misalignment section thereof and in turn sequentially decreases little by little in the range from the maximum misalignment section of the display area 1180 to the peripheral section 1482 thereof. The light-shielding pattern 1360 to be noticed corresponds to the wiring pattern 1340 to be noticed.

Accordingly, the plurality of light-shielding patterns 1360 is respectively disposed over the plurality of wiring patterns 1340 after the array substrate 1140 and the counter substrate 1141 are bent, thereby an occurrence of disadvantages, such as leakages of light in oblique directions and mixing of different colors, that is attributed to a misalignment between the array substrate 1140 and the counter substrate 1141 which is caused when the array substrate 1140 and the counter substrate 1141 are bent being reduced. Especially, an occurrence of such disadvantages in the peripheral section 1482 of the display area 1180 is appropriately reduced. Consequently, a liquid crystal display 1000 that can display high-quality images is provided.

In addition, in the first preferred embodiment, the plurality of light-shielding patterns 1360 have the same width in the curved direction 1100.

Accordingly, the plurality of light-shielding patterns 1360 do not include a light-shielding pattern having a wider width in the curved direction 1100. This prevents the width, in the curved direction 1100, of the opening between adjacent pairs of light-shielding patterns 1360 from being smaller, helping making luminance of the display surface 1180 uniform.

2.5 Shift Amount in Central Section

In the central section 1480 of the display area 1180, each of the pixel pitch of the array substrate 1140 and the pixel pitch of the counter substrate 1141 is the pixel pitch P. Thus, when a position of a wiring pattern 1340 to be noticed in the curved direction 1100 is in the central section 1480 of the display area 1180, the shift amount is zero. A reason for this is that, due to the fact that the central section 1480 of the display area 1180 is positioned at the peak of the curved shape, the relative relationship between the position, in the curved direction 1100, of the wiring pattern 1340 and the position, in the curved direction 1100, of the light-shielding pattern 1360 to which the wiring pattern 1340 corresponds hardly changes in the central section 1480 of the display area 1180 before and after the array substrate 1140 and the counter substrate 1141 are bent.

2.6 Shift Amount in Peripheral Section

In the peripheral section 1482 of the display area 1180, each of the pixel pitch of the array substrate 1140 and the pixel pitch of the counter substrate 1141 is the pixel pitch P. Thus, when a position, in the curved direction 1100, of a wiring pattern 1340 to be noticed is in the peripheral section 1482 of the display area 1180, the shift amount is zero. A reason for this setting is that, due to the fact the peripheral section 1482 of the display area 1180 is along with the seal material 1142, the relative relationship between a position, in the curved direction 1100, of the wiring pattern 1340 and a position, in the curved direction 1100, of the light-shielding pattern 1360 to which the wiring pattern 1340 corresponds hardly changes in the peripheral section 1482 of the display area 1180 before and after the array substrate 1140 and the counter substrate 1141 are bent, due to the influence of bonding and fixing by the seal material 1142.

However, if the peripheral section 1482 of the display area 1180 is away from the seal material 1142, the shift amount may be a value other than zero even when a position of a wiring pattern 1340 to be noticed in the curved direction 1100 is in the peripheral section 1482 of the display area 1180.

2.7 Selection of Substrate Whose Pixel Pitch is Adjusted

In the first preferred embodiment, the pixel pitch of the array substrate 1140 is maintained to be the regular pixel pitch P, whereas the pixel pitch of the counter substrate 1141 is not maintained to be the regular pixel pitch P. Therefore, in the case where the shift amount is not zero, the position of a wiring pattern 1340 to be noticed in the curved direction 1100 is not shifted from the position of the wiring pattern 1340 in the curved direction 1100 when the array substrate 1140 is in a flat state and the plurality of wiring patterns 1340 are arrayed at regular pitch. However, the position of a light-shielding pattern 1360 to be noticed in the curved direction 1100 is shifted from the position of the light-shielding pattern 1360 in the curved direction 1100 when the counter substrate 1141 is in a flat state and the plurality of light-shielding patterns 1360 are arrayed at regular pitch.

Alternatively, the pixel pitch of the array substrate 1140 is permitted not to be maintained as the regular pixel pitch P, whereas the pixel pitch of the counter substrate 1141 is permitted to be maintained as the regular pixel pitch P. In this case, the position of a wiring pattern 1340 to be noticed in the curved direction 1100 is shifted from the position of the wiring pattern 1340 in the curved direction 1100 when the array substrate 1140 is in a flat state and the plurality of wiring patterns 1340 are arrayed at regular pitch. However, the position of a light-shielding pattern 1360 to be noticed in the curved direction 1100 is not shifted from the position of the light-shielding pattern 1360 in the curved direction 1100 when the counter substrate 1141 is in a flat state and the plurality of light-shielding patterns 1360 are arrayed at regular pitch.

Alternatively, both of the pixel pitch of the array substrate 1140 and the pixel pitch of the counter substrate 1141 are permitted not to be maintained to be the regular pixel pitch P. In this case, the position of a wiring pattern 1340 to be noticed in the curved direction 1100 is shifted from the position of the wiring pattern 1340 in the curved direction 1100 when the array substrate 1140 is in a flat state and the plurality of wiring patterns 1340 are arrayed at regular pitch. Also, the position of a light-shielding pattern 1360 to be noticed in the curved direction 1100 is shifted from the position of the light-shielding pattern 1360 in the curved direction 1100 when the counter substrate 1141 is in a flat state and the plurality of light-shielding patterns 1360 are arrayed at regular pitch.

2.8 Shift Direction

In the first preferred embodiment, the counter substrate 1141 is disposed on the incurved side of the array substrate 1140. Therefore, in the case where the shift amount is not zero, the position of a light-shielding pattern 1360 to be noticed in the curved direction 1100 when the counter substrate 1141 is in a flat state is shifted, to the peripheral section 1482 of the display area 1180, from the position of a wiring pattern 1340 to be noticed in the curved direction 1100 when the array substrate 1140 is in a flat state.

Alternatively, the array substrate 1140 may be disposed on the incurved side of the counter substrate 1141. In this case, in the case where the shift amount is not zero, the position of a wiring pattern 1340 to be noticed in the curved direction 1100 when the array substrate 1140 is in a flat state may be shifted, to the peripheral section 1482 of the display area 1180, from the position of a light-shielding pattern 1360 to be noticed in the curved direction 1100 when the counter substrate 1141 is in a flat state.

2.9 Position of Peak of Curved Shape

In the first preferred embodiment, the central section 1480 of the display area 1180 is positioned at the peak of the curved shape.

However, the central section 1480 of the display area 1180 does not necessarily have to be positioned at the peak of the curved shape. If the central section 1480 of the display area 1180 is not positioned at the peak of the curved shape, the pixel pitch of the counter substrate 1141 sequentially increases little by little in the range from the peak of the curved shape to the maximum misalignment section of the display area 1180, is maximized in the maximum misalignment section of the display area 1180, and sequentially decreases little by little in the range from the maximum misalignment section of the display area 1180 to the peripheral section 1482 thereof. Therefore, in the case where the position of a wiring pattern 1340 to be noticed in the curved direction 1100 is displaced from the peak of the curved shape to the peripheral section 1482 of the display area 1180, the shift amount first increases and then decreases, the shift amount being a shifted amount of the position of a light-shielding patterns 1360 to be noticed in the curved direction 1100 when the counter substrate 1141 is in a flat state from the position of the wiring pattern 1340 to be noticed in the curved direction 1100 when the array substrate 1140 is in a flat state.

2.10 Example of Complicatedly Curved Shape

Consider the case where the liquid crystal panel 1020 is curved so at to form a S-like curve, thereby a peak at which the outer main surface 1200 of the counter substrate 1141 is concavely curved and a peak at which the outer main surface 1200 of the counter substrate 1141 is convexly curved being present.

In this case, when the counter substrate 1141 is in a flat state, the pixel pitch of the counter substrate 1141 sequentially increases little by little in the range from the former peak of the curved shape to the maximum misalignment section of the display area 1180, is maximized in the maximum misalignment section of the display area 1180, and sequentially decreases little by little in the range from the maximum misalignment section of the display area 1180 to the peripheral section 1482 thereof.

Moreover, when the counter substrate 1141 is in a flat state, the pixel pitch of the counter substrate 1141 sequentially decreases little by little in the range from the latter peak of the curved shape to the maximum misalignment section of the display area 1180, is minimized in the maximum misalignment section of the display area 1180, and sequentially increases little by little in the range from the maximum misalignment section of the display area 1180 to the peripheral section 1482 thereof.

Accordingly, in the case where the position of a wiring pattern 1340 to be noticed in the curved direction 1100 is displaced from the former peak of the curved shape to the peripheral section 1482 of the display area 1180, the shift amount first increases and then decreases, the shift amount being a shifted amount of the position of a light-shielding pattern 1360 to be noticed in the curved direction 1100 when the counter substrate 1141 is in a flat state from the position of the wiring pattern 1340 to be noticed in the curved direction 1100 when the array substrate 1140 is in a flat state. In this case, the position of the light-shielding pattern 1360 to be noticed in the curved direction 1100 is shifted, toward the peripheral section 1482 of the display area 1180, from the position of the wiring pattern 1340 to be noticed in the curved direction 1100.

In the case where the position of a wiring pattern 1340 to be noticed in the curved direction 1100 is displaced from the latter peak of the curved shape to the peripheral section 1482 of the display area 1180, the shift amount first increases and then decreases, the shift amount being a shifted amount of the position of a light-shielding pattern 1360 to be noticed in the curved direction 1100 when the counter substrate 1141 is in a flat state from the position of the wiring pattern 1340 to be noticed in the curved direction 1100 when the array substrate 1140 is in a flat state. In this case, the position of the wiring pattern 1340 to be noticed in the curved direction 1100 is shifted, toward the peripheral section 1482 of the display area 1180, from the position of the light-shielding pattern 1360 to be noticed in the curved direction 1100.

2.11 Aspect of Variation of Shift Amount

In the first preferred embodiment, the pixel pitch of the counter substrate 1141 varies in a sequence, so the shift amount varies in a sequence. However, the pixel pitch of the counter substrate 1141 may vary in a stepwise manner. In this case, the region from the central section 1480 of the display area 1180 to the peripheral section 1482 thereof is divided into a plurality of sub-regions. In each sub-region which is each of the plurality of sub-regions, the pixel pitch of the counter substrate 1141 is maintained to be the pixel pitch unique to each sub-region.

When the region from the central section 1480 of the display area 1180 to the peripheral section 1482 thereof is divided into a plurality of sub-regions, the pixel pitch of the array substrate 1140 and the pixel pitch of the counter substrate 1141 are maintained to be the regular pixel pitch P in a sub-region which contains the central section 1480 of the display area 1180, for example. A reason for this is that in the central section 1480 of the display area 1180 and its neighboring area, the relative relationship between the position of the wiring pattern 1340 in the curved direction 1100 and the position of the light-shielding pattern 1360 to which the wiring pattern 1340 corresponds in the curved direction 1100 hardly changes before and after the array substrate 1140 and the counter substrate 1141 are bent, as illustrated in FIG. 12.

If two or more sub-regions are left as remaining at least one sub-region, a region which occupies about ⅓ of the entire region from the central section 1480 of the display area 1180 to the peripheral section 1482 thereof and contains the peripheral section 1482 of the display area 1180 is further divided into two or more sub-regions. A reason for this is that in the region that occupies about ⅓ of the entire region and contains the peripheral section 1482 of the display area 1180, the relative relationship between the position of the wiring pattern 1340 in the curved direction 1100 and the position of the light-shielding pattern 1360 to which the wiring pattern 1340 corresponds in the curved direction 1100 greatly changes before and after the array substrate 1140 and the counter substrate 1141 are bent, as illustrated in FIG. 12. In the region that occupies about ⅓ of the entire region and contains the peripheral section 1482 of the display area 1180, the pixel pitch of the counter substrate 1141 may vary in a continuous manner with distance from the central section 1480 of the display area 1180.

2.12 Specific Values of Shift Amounts

Specific values of the shift amounts are determined through a calculation in a simulation or through an experiment.

The calculation in a simulation may be performed on the basis of information regarding: a curvature of the curved shape; a thickness of the array substrate 1140; a thickness of the counter substrate 1141; a size of the array substrate 1140 such as its outer size; a size of the counter substrate 1141 such as its outer size; a range of the display area 1180; a position of a region in which the seal material 1142 is provided; and a cell gap that is the distance from the array substrate 1140 to the counter substrate 1141, for example. For the calculation in a simulation, a model may be used in which the region where the seal material 1142 is provided is used as a fixed end, and the array substrate 1140 and the counter substrate 1141 are curved.

Specific values of the shift amounts, especially the shift amount in the maximum misalignment section is preferably determined through an experiment.

The tendencies of shift amounts illustrated in FIG. 12 may be reflected in specific values of the shift amounts. For example, the entire region from the central section 1480 of the display area 1180 to the peripheral section 1482 thereof may divided into a first sub-region and a second sub-region; the first sub-region occupies about ⅓ of the entire region and contains the central section 1480 of the display area 1180, and the second sub-region occupies the remaining region of the entire region. In addition, the shift amount is set to zero in the first sub-region. The shift amount may sequentially increase little by little in the first sub-region. In the second sub-region, the shift amount monotonously increases from a boundary value at a border between the first sub-region and the second sub-region to the maximum value in the range from the border to the maximum misalignment section, and monotonously decreases from the maximum value to zero in the range from the maximum misalignment section to the peripheral section 1482 of the display area 1180. The maximum misalignment section is defined so that the region from the maximum misalignment section to the peripheral section 1482 of the display area 1180 occupies about ⅙ of the entire region.

2.13 Manufacturing of Liquid Crystal Display

Figure 4:
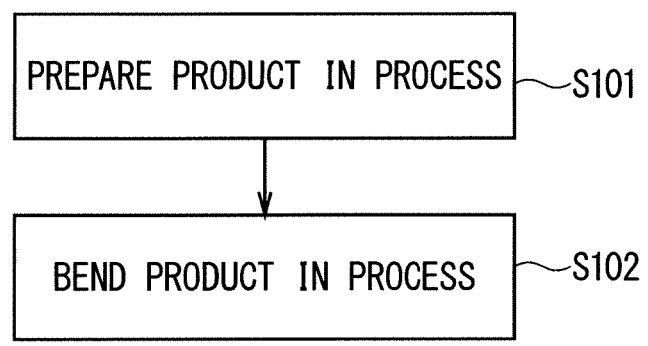
FIG. 4 is a flowchart of main steps in a method of manufacturing the liquid crystal display of the first preferred embodiment.

FIG. 4 is a flowchart of main steps in a method of manufacturing the liquid crystal display in the first preferred embodiment.

At Step S101 illustrated in FIG. 4, a product in process for the liquid crystal panel 1020 is prepared.

The product in process includes the array substrate 1140, the counter substrate 1141, the seal material 1142, and the liquid crystal material 1143.

The product in process is in a flat state. In the product in process, thus, the array substrate 1140 and the counter substrate 1141 are in a flat state.

In the product in process, the plurality of wiring patterns 1340 are arrayed in a predetermined direction, and the light-shielding patterns 1360 are arrayed in the predetermined direction.

In the product in process, when the position of a wiring pattern 1340 to be noticed in the curved direction 1100 is displaced from the central section 1480 of the display area 1180 to the peripheral section 1482 thereof, the shift amount first increases and then decreases.

At Step S102, the array substrate 1140 and the counter substrate 1141 are bent in the predetermined direction with the counter substrate 1141 fitting on the array substrate 1140 in such a way that the central section 1480 of the display area 1180 is positioned at the peak of the curved shape. In this way, the liquid crystal panel 1020 having a curved shape is obtained. Step S102 may be performed in the course of Step S101, such as before the liquid crystal material 1143 is injected. Alternatively, any section of the display area 1180 other than the central section 1480 may be positioned at the peak of the curved shape.

3 Second Preferred Embodiment 3.1 Main Difference Between First and Second Preferred Embodiments The second preferred embodiment relates to light-shielding patterns and a coloring section array that respectively replace the light-shielding patterns 1360 and the coloring section array 1380 included in the liquid crystal display 1000 of the first preferred embodiment. A main difference between the first and second preferred embodiments is as follows. In the first preferred embodiment, the shift amount of the position of the light-shielding pattern 1360 from the position of the wiring pattern 1340 varies by the pixel. In the second preferred embodiment, however, the shift amount of the position of the light-shielding pattern 1360 from the position of the wiring pattern 1340 varies by the picture element. It should be noted that some configurations that have been employed by the first preferred embodiment may also be employed by the second preferred embodiment with or without modifications, unless the configurations affect the employment of configurations that ensure the above difference.

3.2 Light-Shielding Patterns and Coloring Section Array

Figure 5:
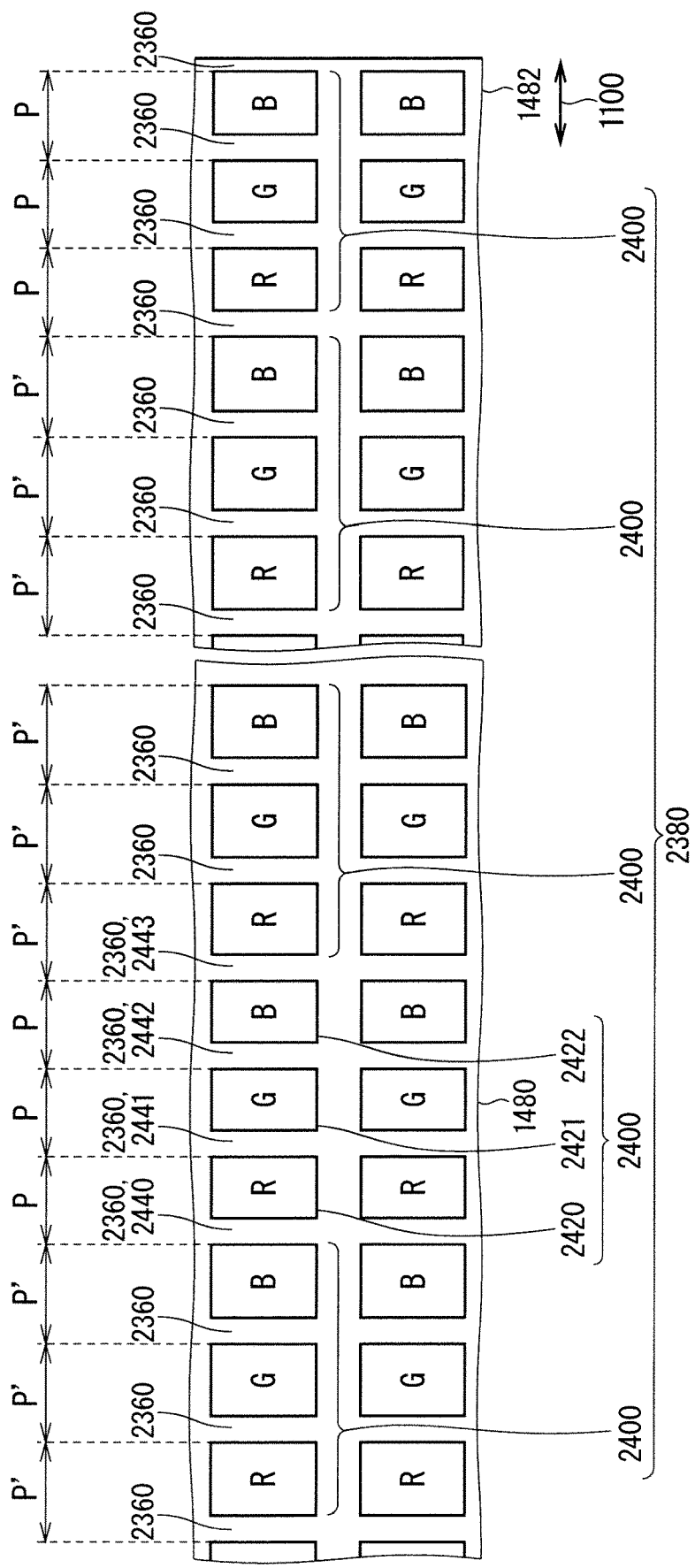
FIG. 5 is a plan view of light-shielding patterns and coloring sections of a second preferred embodiment of the present invention.

FIG. 5 is a plan view of the light-shielding patterns and the coloring section array of the second preferred embodiment. FIG. 5 illustrates planar shapes of the light-shielding patterns and the coloring section array when the counter substrate is in a flat state.

A plurality of light-shielding patterns 2360 illustrated in FIG. 5 are arrayed in a curved direction 1100.

The coloring section array 2380 illustrated in FIG. 5 includes a plurality of repetition units 2400. The plurality of repetition units 2400 are arrayed in the curved direction 1100.

Each of the plurality of repetition units 2400 includes a first coloring section 2420, a second coloring section 2421, and a third coloring section 2422. The first coloring section 2420, the second coloring section 2421, and the third coloring section 2422 belong to the same picture element, and respectively serve as openings through which red, green and blue light selectively passes. The first coloring section 2420, the second coloring section 2421, and the third coloring section 2422 may be replaced with three or more coloring sections that respectively transmit light with three or more colors other than red, green, and blue.

The plurality of light-shielding patterns 2360 include a first light-shielding pattern 2440, a second light-shielding pattern 2441, a third light-shielding pattern 2442, and a fourth light-shielding pattern 2443, corresponding to each of the plurality of repetition units 2400. Among the first light-shielding pattern 2440, the second light-shielding pattern 2441, the third light-shielding pattern 2442, and the fourth light-shielding pattern 2443, the i-th light-shielding pattern is adjacent to the (i+1)th light-shielding pattern, and the i-th coloring section is present between the i-th and (i+1)th light-shielding patterns. The number i is each of integers of 1 to 3.

As illustrated in FIG. 2, the plurality of wiring patterns 1340 include a first wiring pattern 1460, a second wiring pattern 1461, a third wiring pattern 1462, and a fourth wiring pattern 1463, corresponding to each of a plurality of repetition units 2400. The first wiring pattern 1460, the second wiring pattern 1461, the third wiring pattern 1462, and the fourth wiring pattern 1463 respectively correspond to the first light-shielding pattern 2440, the second light-shielding pattern 2441, the third light-shielding pattern 2442, and the fourth light-shielding pattern 2443.

3.3 Variation in Shift Amount

The plurality of light-shielding patterns 2360 respectively correspond to the plurality of wiring patterns 1340.

In the second preferred embodiment, when an array substrate 1140 is in a flat state, the pixel pitch of the array substrate 1140 is maintained to be regular pixel pitch P. In contrast, when the counter substrate 1141 is in a flat state, the pixel pitch of the counter substrate 1141, which is the distance between adjacent ones of the plurality of light-shielding patterns 2360, is not maintained to be the regular pixel pitch P, as illustrated in FIG. 5. The pixel pitch of the counter substrate 1141 takes the pixel pitch P which is the same as the pixel pitch of the array substrate 1140 in the central section 1480 of the display area 1180. It sequentially increases little by little in the range from the central section 1480 of the display area 1180 to the maximum misalignment section thereof. It is maximized in the maximum misalignment section of the display area 1180. It sequentially decreases little by little in the range from the maximum misalignment section of the display area 1180 to the peripheral section 1482 thereof. It takes the pixel pitch P again in the peripheral section 1482 of the display area 1180.

Thus, in the case where the position of a wiring pattern 1340 to be noticed in the curved direction 1100 is displaced from the central section 1480 of the display area 1180 to the peripheral section 1482 thereof, the shift amount first increases and then decreases, the shift amount being a shifted amount of the position of a light-shielding pattern 2360 to be noticed in the curved direction 1100 when the counter substrate 1141 is in a flat state from the position of the wiring pattern 1340 to be noticed in the curved direction 1100 when the array substrate 1140 is in a flat state, the light-shielding pattern 2360 to be noticed corresponding to the wiring pattern 1340 to be noticed. The shift amount is maximized in the maximum misalignment section of the display area 1180. Accordingly, the shift amount sequentially increases little by little in the range from the central section 1480 of the display area 1180 to the maximum misalignment section thereof and in turn sequentially decreases little by little in the range from the maximum misalignment section of the display area 1180 to the peripheral section 1482 thereof.

Accordingly, the plurality of light-shielding patterns 2360 is respectively disposed over the plurality of wiring patterns 1340 after the array substrate 1140 and the counter substrate 1141 are bent, thereby an occurrence of disadvantages, such as leakages of light in oblique directions and mixing of different colors, that is attributed to a misalignment between the array substrate 1140 and the counter substrate 1141 which is caused when the array substrate 1140 and the counter substrate 1141 are bent being reduced. Especially, an occurrence of such disadvantages in the peripheral section 1482 of the display area 1180 is appropriately reduced. Consequently, a liquid crystal display 1000 that can display high-quality images is provided.

In the second preferred embodiment, when the position of a wiring pattern 1340 to be noticed in the curved direction 1100 is displaced from the central section 1480 of the display area 1180 to the peripheral section 1482 thereof, the shift amount varies by the picture element including red, green, and blue pixels.

Thus, when the counter substrate 1141 is in a flat state, the first light-shielding pattern 2440, the second light-shielding pattern 2441, the third light-shielding pattern 2442, and the fourth light-shielding pattern 2443 are arrayed at regular pitch in each of the plurality of repetition units 2400. When the array substrate 1140 is in a flat state, the first wiring pattern 1460, the second wiring pattern 1461, the third wiring pattern 1462, and the fourth wiring pattern 1463 are also arrayed at regular pitch in each of the plurality of repetition units 2400.

As a result, the proportion of the opening areas of: the first coloring section 2420 that is an opening through which red light selectively passes; the second coloring section 2421 that is an opening through which green light selectively passes; and the third coloring section 2422 that is an opening through which blue light beam selectively passes is fixed to specific proportion. This means that the proportion of opening areas does not vary by the picture element, and thus white chromaticity does not vary by the picture element. This can help reducing a variation in the white chromaticity in the display area 1180.

4 Third Preferred Embodiment

4.1 Main Difference Between First and Third Preferred Embodiments

The third preferred embodiment relates to wiring patterns, light-shielding patterns, and a coloring section array that respectively replace the wiring patterns 1340, the light-shielding patterns 1360, and the coloring section array 1380 included in the liquid crystal display 1000 of the first preferred embodiment. A main difference between the first and third preferred embodiments is as follows. In the first preferred embodiment, the pixel pitch of the array substrate 1140 is maintained to be the regular pixel pitch P, whereas the pixel pitch of the counter substrate 1141 is not maintained to be the regular pixel pitch P. In the third preferred embodiment, however, neither of the pixel pitch of the array substrate and the pixel pitch of the counter substrate is maintained to be the regular pixel pitch P. It should be noted that some configurations that have been employed by the first preferred embodiment may also be employed by the third preferred embodiment with or without modifications, unless the configurations affect the employment of configurations that ensure the above difference.

4.2 Wiring Patterns, Light-Shielding Patterns, and Coloring Section Array

Figure 6:
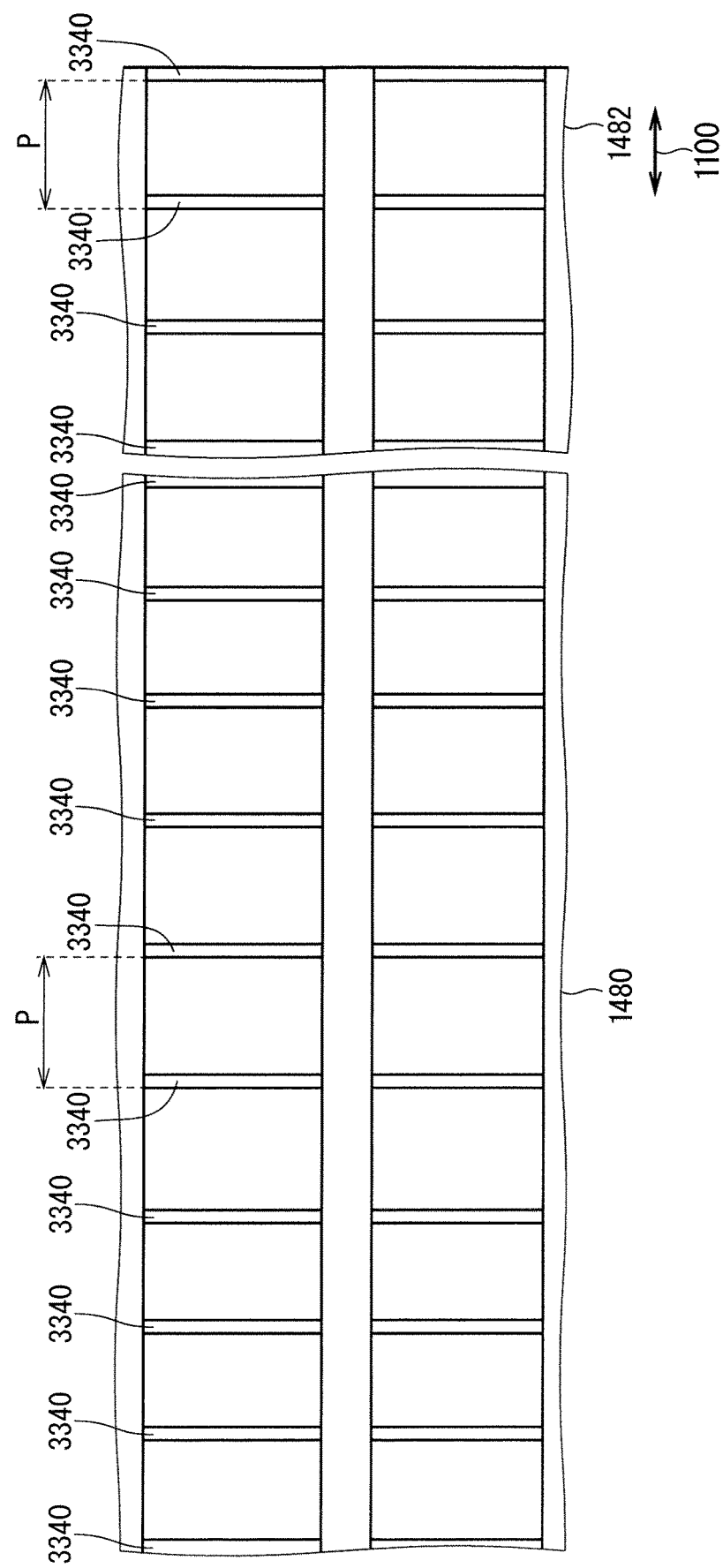
FIG. 6 is a plan view of wiring patterns of a third preferred embodiment of the present invention.
Figure 7:
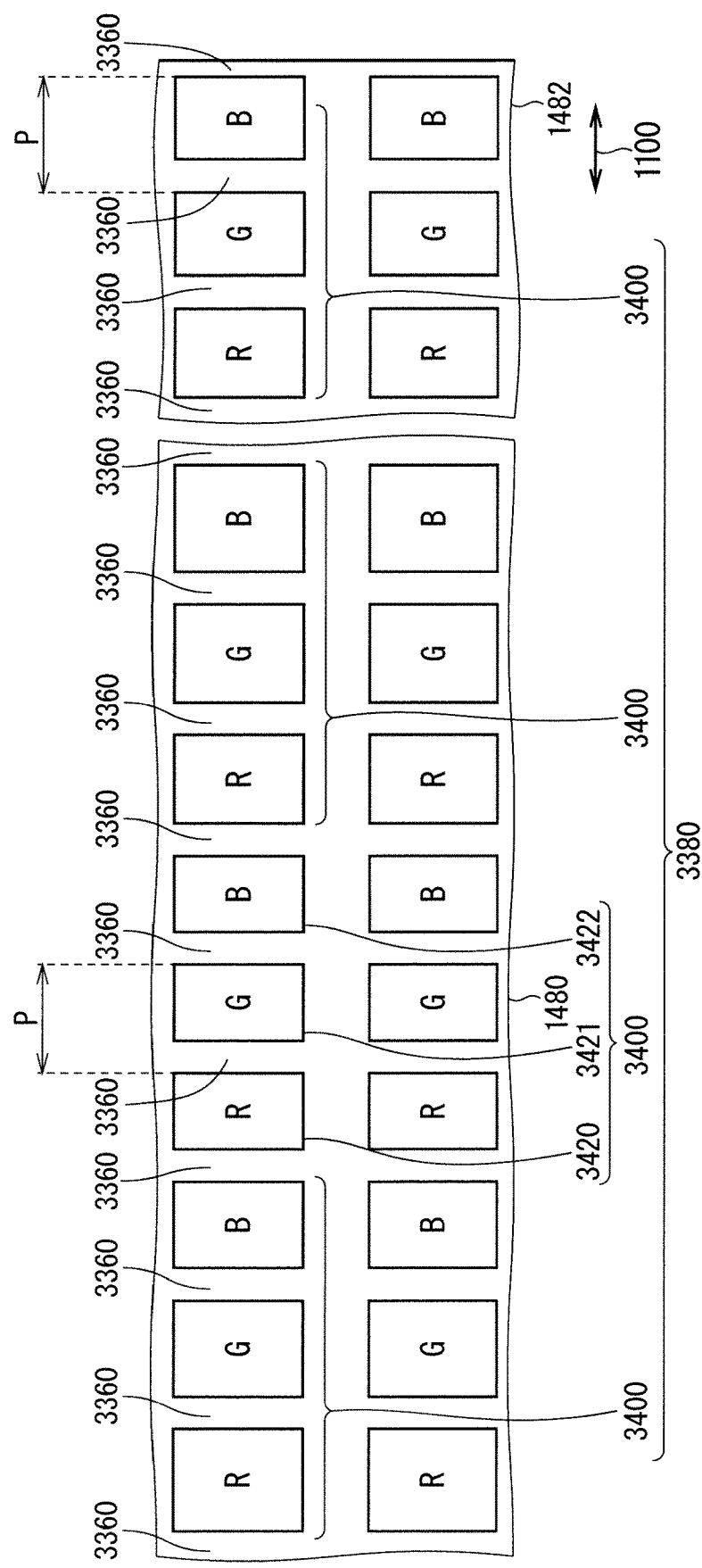
FIG. 7 is a plan view of light-shielding patterns and coloring sections of the third preferred embodiment.

FIG. 6 is a plan view of wiring patterns of the third preferred embodiment. FIG. 7 is a plan view of light-shielding patterns and a coloring section array of the third preferred embodiment.

FIG. 6 illustrates planar shapes of the wiring patterns when an array substrate is in a flat state. FIG. 7 illustrates planar shapes of the light-shielding patterns and a coloring section array when a counter substrate is in a flat state.

A plurality of wiring patterns 3340 illustrated in FIG. 6 are arrayed in a curved direction 1100.

A plurality of light-shielding patterns 3360 illustrated in FIG. 7 are arrayed in the curved direction 1100.

A coloring section array 3380 illustrated in FIG. 7 includes a plurality of repetition units 3400. Each of the plurality of repetition units 3400 includes a first coloring section 3420, a second coloring section 3421, and a third coloring section 3422.

4.3 Variation in Shift Amount

The plurality of light-shielding patterns 3360 respectively correspond to the plurality of wiring patterns 3340.

In the third preferred embodiment, when the array substrate 1140 is in a flat state, the pixel pitch of the array substrate 1140, which is the distance between adjacent ones of a plurality of wiring patterns 3340, is not maintained to be the regular pixel pitch P, as illustrated in FIG. 6. The pixel pitch of the array substrate 1140 takes pixel pitch P in the central section 1480 of the display area 1180. It sequentially decreases little by little in the range from the central section 1480 of the display area 1180 to the maximum misalignment section thereof. It is minimized in the maximum misalignment section of the display area 1180. It sequentially increases little by little in the range from the maximum misalignment section of the display area 1180 to the peripheral section 1482 thereof. It takes the pixel pitch P again in the peripheral section 1482 of the display area 1180. In addition, when the counter substrate 1141 is in a flat state, the pixel pitch of the counter substrate 1141, which is the distance between adjacent ones of the plurality of light-shielding patterns 3360, is not maintained to be the regular pixel pitch P, as illustrated in FIG. 7. The pixel pitch of the counter substrate 1141 takes the pixel pitch P which is the same as the pixel pitch of the array substrate 1140 in the central section 1480 of the display area 1180. It sequentially increases little by little in the range from the central section 1480 of the display area 1180 to the maximum misalignment section thereof. It is maximized in the maximum misalignment section of the display area 1180. It sequentially decreases little by little in the range from the maximum misalignment section of the display area 1180 to the peripheral section 1482 thereof. It takes the pixel pitch P which is the same as the pixel pitch of the array substrate 1140 again in the peripheral section 1482 of the display area 1180.

Thus, in the case where the position, in the curved direction 1100, of a wiring pattern 3340 to be noticed among the plurality of wiring patterns 3340 is displaced from the central section 1480 of the display area 1180 to the peripheral section 1482 thereof, the shift amount first increases and then decreases. the shift amount being a shifted amount of the position, in the curved direction 1100, of a light-shielding pattern 3360 to be noticed among the plurality of light-shielding patterns 3360 when the counter substrate 1141 is in a flat state from the position of the wiring pattern 3340 to be noticed in the curved direction 1100 when the array substrate 1140 is in a flat state. The shift amount is maximized in the maximum misalignment section of the display area 1180. Accordingly, the shift amount sequentially increases little by little in the range from the central section 1480 of the display area 1180 to the maximum misalignment section thereof and in turn sequentially decreases little by little in the range from the maximum misalignment section of the display area 1180 to the peripheral section 1482 thereof.

Accordingly, the plurality of light-shielding patterns 3360 is respectively disposed over the plurality of wiring patterns 3340 after the array substrate 1140 and the counter substrate 1141 are bent, thereby an occurrence of disadvantages, such as leakages of light in oblique directions and mixing of different colors, that is attributed to a misalignment between the array substrate 1140 and the counter substrate 1141 which is caused when the array substrate 1140 and the counter substrate 1141 are bent being reduced. Especially, an occurrence of such disadvantages in the peripheral section 1482 of the display area 1180 is appropriately reduced. Consequently, a liquid crystal display 1000 that can display high-quality images is provided.

In the third preferred embodiment, in the case where the shift amount is not zero, the position of a wiring pattern 3340 to be noticed in the curved direction 1100 is shifted, toward a first direction, from the position of the wiring pattern 3340 in the curved direction 1100 when the array substrate 1140 is in a flat state and the plurality of wiring patterns 3340 are disposed at regular pitch. In addition, the position of a light-shielding pattern 3360 to be noticed in the curved direction 1100 is shifted, toward a second direction, from the position of the light-shielding pattern 3360 in the curved direction 1100 when the counter substrate 1141 is in a flat state and the plurality of light-shielding patterns 3360 are disposed at regular pitch. The first and second direction are opposite to each other.

The shift amount of the position of a wiring pattern 3340 to be noticed in the curved direction 1100 toward the first direction is preferably set to a half the shift amount of the position of a light-shielding pattern 3360 to be noticed in the curved direction 1100 from the position of the wiring pattern 3340 to be noticed in the curved direction 1100. The shift amount of the position of a light-shielding pattern 3360 to be noticed in the curved direction 1100 toward the second direction is preferably set to a half the shift amount of the position of the light-shielding pattern 3360 to be noticed in the curved direction 1100 from the position of a wiring pattern 3340 to be noticed in the curved direction 1100.

Accordingly, the variation in the pitch of the wiring patterns 3340 and the variation in the pitch of the light-shielding patterns 3360 can be reduced by half in the entire liquid crystal panel 1020.

5 Fourth Preferred Embodiment 5.1 Main Difference Between First and Fourth Preferred Embodiments A fourth preferred embodiment relates to light-shielding patterns and a coloring section array that respectively replace the light-shielding patterns 1360 and the coloring section array 1380 included in the liquid crystal display 1000 of the first preferred embodiment. A main difference between the first and fourth preferred embodiments is as follows. In the first preferred embodiment, the shift amount of the positions of the light-shielding pattern 1360 from the position of the wiring patterns 1340 varies. In the fourth preferred embodiment, however, the width of light-shielding pattern in a curved direction varies. It should be noted that some configurations that have been employed by the first preferred embodiment may also be employed by the fourth preferred embodiment with or without modifications, unless the configurations affect the employment of configurations that ensure the above difference.

5.2 Light-Shielding Patterns and Coloring Section

Figure 8:
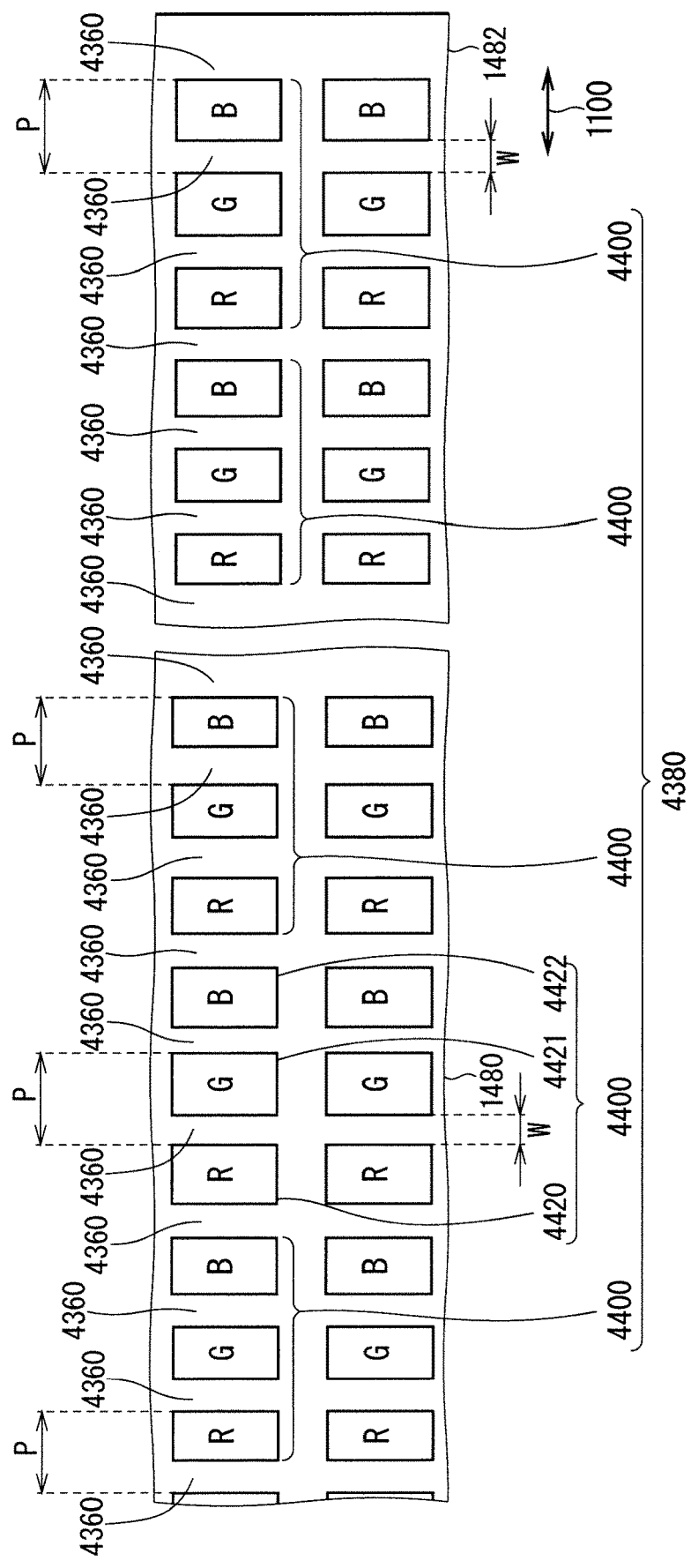
FIG. 8 is a plan view of light-shielding patterns and coloring sections of a fourth preferred embodiment of the present invention.

FIG. 8 is a plan view of light-shielding patterns and a coloring section array in the fourth preferred embodiment. FIG. 8 illustrates planar shapes of the light-shielding patterns and the coloring section array when a counter substrate is in a flat state.

A plurality of light-shielding patterns 4360 illustrated in FIG. 8 are arrayed in a curved direction 1100.

A coloring section array 4380 illustrated in FIG. 8 includes a plurality of repetition units 4400. Each of the plurality of repetition units 4400 includes a first coloring section 4420, a second coloring section 4421, and a third coloring section 4422.

5.3 Variation in Width of Light-Shielding Pattern

The plurality of light-shielding patterns 4360 respectively correspond to a plurality of wiring patterns 1340.

In the fourth preferred embodiment, when an array substrate 1140 is in a flat state, the pixel pitch of the array substrate 1140 is maintained to be regular pixel pitch P. In addition, when a counter substrate 1141 is in a flat state, the pixel pitch of the counter substrate 1141, which is the distance between adjacent ones of the plurality of light-shielding patterns 4360, is maintained to be the regular pixel pitch P, as illustrated in FIG. 8. The pixel pitch of the counter substrate 1141 is set to the pixel pitch P in any of a central section 1480 of a display area 1180, a maximum misalignment section thereof, and a peripheral section 1482 thereof.

In the fourth preferred embodiment, when the position, in the curved direction 1100, of a light-shielding pattern 4360 to be noticed among the plurality of light-shielding patterns 4360 is displaced from the central section 1480 of the display area 1180 to the peripheral section 1482 thereof, the width of the light-shielding pattern 4360 to be noticed in the curved direction 1100 first increases and then decreases. The width of the light-shielding pattern 4360 to be noticed in the curved direction 1100 takes a width W in the central section 1480 of the display area 1180. It sequentially increases little by little in the range from the central section 1480 of the display area 1180 to the maximum misalignment section thereof. It is maximized in the maximum misalignment section of the display area 1180. It sequentially decreases little by little in the range from the maximum misalignment section of the display area 1180 to the peripheral section 1482 thereof. It takes the width W again in the peripheral section 1482 of the display area 1180. The width W is a width of each light-shielding pattern 4360 when the liquid crystal panel 1020 is in a flat state. This width W is determined in terms of avoiding a leakage of light in oblique directions. Specifically, the width W may be a design-based width of a light-shielding pattern 4360 which is applicable to a non-curved liquid crystal display.

Accordingly, the plurality of light-shielding patterns 4360 is respectively disposed over the plurality of wiring patterns 1340 after the array substrate 1140 and the counter substrate 1141 are bent, an occurrence of disadvantages, such as leakages of light in oblique directions and mixing of different colors, that is attributed to a misalignment between the array substrate 1140 and the counter substrate 1141 which is caused when the array substrate 1140 and the counter substrate 1141 are bent being reduced. Especially, an occurrence of such disadvantages in the peripheral section 1482 of the display area 1180 is appropriately reduced. Consequently, a liquid crystal display 1000 that can display high-quality images is provided.

In addition, the width of each of the plurality of light-shielding patterns 4360 is allowed to be increased in the curved direction 1100 as needed, thereby minimizing the risk of the luminance being lowered.

In addition, although the widths of the plurality of light-shielding patterns 4360 in the curved direction 1100 are modified, the pixel pitch of the counter substrate 1141 is maintained to be regular pitch. This can reduce variation in proportion of opening in the liquid crystal panel 1020 with the position in the curved direction 1100.

In the fourth preferred embodiment, the counter substrate 1141 is disposed on the incurved side of the array substrate 1140. Thus, the array substrate 1140 corresponds to a first substrate. The wiring patterns 1340 provided in the array substrate 1140 as light-shielding patterns correspond to first light-shielding patterns. The counter substrate 1141 corresponds to a second substrate. The light-shielding patterns 4360 provided in the counter substrate 1141 correspond to second light-shielding patterns. The first substrate is a substrate in which the width of the first light-shielding pattern does not vary. The second substrate is a substrate in which the width of the second light-shielding pattern varies.

Alternatively, the array substrate 1140 may be disposed on the incurved side of the counter substrate 1141. In this case, the counter substrate 1141 corresponds to the first substrate. The light-shielding patterns 4360 provided in the counter substrate 1141 correspond to the first light-shielding patterns. The array substrate 1140 corresponds to the second substrate. The wiring pattern 1340 provided in the array substrate 1140 corresponds to the second light-shielding pattern.

The foregoing preferred embodiments in the present invention may be combined optionally or may be modified or omitted as appropriately within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A liquid crystal display comprising:
  an array substrate that is curved in a curved direction and that includes a plurality of inter-pixel patterns disposed within a display area, said plurality of inter-pixel patterns being arrayed in said curved direction; and
  a counter substrate that is curved in said curved direction so as to fit on said array substrate and that includes a plurality of light-shielding patterns disposed within said display area, said plurality of light-shielding patterns being arrayed in said curved direction, said plurality of light-shielding patterns respectively corresponding to said plurality of inter-pixel patterns, wherein
  a shift amount is a shifted amount of one light-shielding pattern, among said plurality of light-shielding patterns when said counter substrate is in a flat state, from a position of a respective inter-pixel pattern, among said plurality of inter-pixel pattern, when said array substrate is in a flat state, such that, in a curved state wherein said counter substrate and said array substrate each have a curved shape, said one light-shielding pattern overlaps with said respective inter-pixel pattern, and
  from a peak of said curved shape towards a peripheral section of said display area, said shift amount first increases and then decreases.

2. The liquid crystal display according to claim 1, further comprising a seal material that surrounds the display area and that allows said counter substrate to be bonded to said array substrate, wherein
  said peripheral section is along with said seal material, and
  when the position of said respective inter-pixel pattern is at said peak or within said peripheral section, said shift amount becomes zero.

3. The liquid crystal display according to claim 1, wherein
said counter substrate further includes a coloring section array that includes a plurality of repetition units arrayed in a curved direction, each of said plurality of repetition units including first to n-th coloring sections, n denoting an integer of three or more, said first to n-th coloring sections belonging to the same picture element,
said plurality of light-shielding patterns include first to (n+1)th light-shielding patterns, corresponding to each of said plurality of repetition units, an i-th light-shielding pattern being adjacent to an (i+1)th light-shielding pattern, an i-th coloring section is present between the i-th light-shielding pattern and the (i+1)th light-shielding pattern, i being each of integers of 1 to n, the first to (n+1)th light-shielding patterns being arrayed at regular pitch when said counter substrate is in a flat state, and
said plurality of inter-pixel patterns include first to (n+1)th inter-pixel patterns, corresponding to each of said plurality of repletion units, the first to (n+1)th inter-pixel patterns respectively corresponding to the first to (n+1)th light-shielding patterns, the first to (n+1)th inter-pixel patterns being disposed at regular pitch when said array substrate is in a flat state.

4. The liquid crystal display according to claim 1, wherein
in a case where said shift amount is not zero, the position of said respective inter-pixel pattern is shifted, toward a first direction, from the position of said respective inter-pixel pattern when said array substrate is in a flat state and said plurality of inter-pixel patterns are disposed at regular pitch, and
in a case where said shift amount is not zero, the position of said one light-shielding pattern is shifted, toward a second direction, from the position of said one light-shielding pattern when said counter substrate is in a flat state and the plurality of light-shielding patterns are disposed at regular pitch, the second direction being opposite to the first direction.

5. The liquid crystal display according to claim 1, wherein
said counter substrate is disposed on an incurved side of said array substrate, and
in a case where the shift amount is not zero, the position of said respective light-shielding pattern when said counter substrate is in a flat state is shifted, toward said peripheral section, from the position of said respective inter-pixel pattern when said array substrate is in a flat state.

6. The liquid crystal display according to claim 1, wherein
said array substrate is disposed on an incurved side of said counter substrate, and
in a case where the shift amount is not zero, the position of said respective inter-pixel pattern when said array substrate is in a flat state is shifted, toward said peripheral section, from the position of the one light-shielding pattern when said counter substrate is in a flat state.

7. A liquid crystal display comprising:
a first substrate that is one of an array substrate and a counter substrate, that is curved in a curved direction, and that includes a plurality of first light-shielding patterns arrayed within a display area, said plurality of first light-shielding patterns being arrayed in said curved direction; and
a second substrate that is the other of said array substrate and said counter substrate, that is curved in said curved direction so as to fit on said first substrate, that is disposed on an incurved side of said first substrate, and that includes a plurality of second light-shielding patterns disposed within said display area, said plurality of second light-shielding patterns being arrayed in said curved direction, said plurality of second light-shielding patterns respectively corresponding to said plurality of first light-shielding patterns, wherein in a case where a position, in said curved direction, of one light-shielding pattern among said plurality of second light-shielding patterns is displaced along a direction from a peak of a curved shape to a peripheral section of said display area, a width of said one light-shielding pattern first increases and then decreases along said direction from a peak of a curved shape to a peripheral section of said display area.

8. A method of manufacturing a liquid crystal display comprising:
 a) preparing a product in process, the product in process including:
 an array substrate that has a flat shape and that includes a plurality of inter-pixel patterns disposed within a display area, said plurality of inter-pixel patterns being arrayed in a particular direction;
 and a counter substrate that has a flat shape and that includes a plurality of light-shielding patterns disposed within said display area, said plurality of light-shielding patterns being arrayed in said particular direction, said plurality of light-shielding patterns respectively corresponding to said plurality of inter-pixel patterns, wherein a shift amount is a shifted amount in said particular direction of one light-shielding pattern, among said plurality of light-shielding patterns when said counter substrate is in a flat state, from a position of a respective inter-pixel pattern, among said plurality of inter-pixel pattern, when said array substrate is in a flat state, such that, in a curved state wherein said counter substrate and said array substrate each have a curved shape, said one light-shielding pattern overlaps with said respective inter-pixel pattern, and in a case where a position, in said particular direction, of one inter-pixel pattern among said plurality of inter-pixel patterns is displaced along a direction from a particular section to a peripheral section of said display area, said shift amount first increases and then decreases; and b) bending said array substrate and said counter substrate in said particular direction with said counter substrate fitting on said array substrate in such a way that said particular section is at a peak of said curved shape.

* * * * *